United States Patent
Yamazaki et al.

(10) Patent No.: US 9,305,944 B2
(45) Date of Patent: Apr. 5, 2016

(54) LIQUID CRYSTAL DISPLAY DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Kaoru Hatano, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 231 days.

(21) Appl. No.: 14/023,515

(22) Filed: Sep. 11, 2013

(65) Prior Publication Data

US 2014/0017834 A1   Jan. 16, 2014

Related U.S. Application Data

(63) Continuation of application No. 13/227,092, filed on Sep. 7, 2011, now Pat. No. 8,558,960.

(30) Foreign Application Priority Data

Sep. 13, 2010 (JP) ................. 2010-204930

(51) Int. Cl.
*G02F 1/136* (2006.01)
*H01L 27/12* (2006.01)
(Continued)

(52) U.S. Cl.
CPC .......... *H01L 27/1259* (2013.01); *G02F 1/1333* (2013.01); *G02F 1/1343* (2013.01); *G02F 1/136213* (2013.01); *H01L 27/1225* (2013.01);
(Continued)

(58) Field of Classification Search
CPC ............ H01L 27/1259; H01L 27/1225; G02F 1/136227; G02F 1/136213; G02F 1/1343; G02F 1/1333
USPC ...................................................... 349/43, 45
See application file for complete search history.

(56) References Cited

U.S. PATENT DOCUMENTS 5,477,355 A  12/1995  Sasaki et al.
5,731,856 A   3/1998  Kim et al.
(Continued)

FOREIGN PATENT DOCUMENTS

CN   001514468 A   7/2004
CN   001610110 A   4/2005
(Continued)

OTHER PUBLICATIONS

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

(Continued)

*Primary Examiner* — James Dudek
(74) *Attorney, Agent, or Firm* — Fish & Richardson P.C.

(57) ABSTRACT

Provided is a method to manufacture a liquid crystal display device in which a contact hole for the electrical connection of the pixel electrode and one of the source and drain electrode of a transistor and a contact hole for the processing of a semiconductor layer are formed simultaneously. The method contributes to the reduction of a photography step. The transistor includes an oxide semiconductor layer where a channel formation region is formed.

22 Claims, 13 Drawing Sheets

(51) Int. Cl.
  *G02F 1/1333* (2006.01)
  *G02F 1/1343* (2006.01)
  *G02F 1/1362* (2006.01)

(52) U.S. Cl.
  CPC ............. *G02F 1/136227* (2013.01); *G02F 2001/136231* (2013.01); *G02F 2201/50* (2013.01)

(56) References Cited

U.S. PATENT DOCUMENTS

| | | | |
|---|---|---|---|
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,414,730 B1* | 7/2002 | Akamatsu et al. | 349/43 |
| 6,563,174 B2 | 5/2003 | Kawasaki et al. | |
| 6,727,522 B1 | 4/2004 | Kawasaki et al. | |
| 6,874,898 B2* | 4/2005 | Akiyama | 359/883 |
| 6,900,854 B1 | 5/2005 | Kim et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,166,498 B2 | 1/2007 | Yoo et al. | |
| 7,205,571 B2 | 4/2007 | Ahn et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,335,573 B2 | 2/2008 | Takayama et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,411,217 B2 | 8/2008 | Yoo et al. | |
| 7,439,586 B2 | 10/2008 | Jung et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,488,632 B2 | 2/2009 | Ahn et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,319,215 B2 | 11/2012 | Yamazaki et al. | |
| 8,367,440 B2 | 2/2013 | Takayama et al. | |
| 8,415,208 B2 | 4/2013 | Takayama et al. | |
| 8,441,425 B2 | 5/2013 | Ishitani et al. | |
| 9,048,144 B2 | 6/2015 | Yamazaki et al. | |
| 2001/0046027 A1 | 11/2001 | Tai et al. | |
| 2002/0056838 A1 | 5/2002 | Ogawa | |
| 2002/0085160 A1 | 7/2002 | Ha et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0043545 A1* | 3/2004 | Yoo et al. | 438/149 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0138428 A1 | 6/2006 | Ahn et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1* | 10/2006 | Thelss et al. | 445/24 |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0049437 A1 | 2/2008 | Takayama et al. | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0093599 A1 | 4/2008 | Byun et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140250 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0290083 A1 | 11/2009 | Lim et al. | |
| 2010/0065844 A1 | 3/2010 | Tokunaga | |
| 2010/0084654 A1* | 4/2010 | Yamazaki et al. | 257/43 |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0163865 A1 | 7/2010 | Arai | |
| 2010/0188593 A1* | 7/2010 | Yamaguchi et al. | 349/43 |
| 2010/0320458 A1 | 12/2010 | Umeda et al. | |
| 2010/0320459 A1 | 12/2010 | Umeda et al. | |
| 2011/0084265 A1 | 4/2011 | Arasawa et al. | |
| 2011/0085104 A1 | 4/2011 | Arasawa et al. | |
| 2011/0193083 A1 | 8/2011 | Kim et al. | |
| 2011/0215328 A1 | 9/2011 | Morosawa et al. | |
| 2012/0052606 A1 | 3/2012 | Yamazaki | |
| 2012/0052625 A1 | 3/2012 | Yamazaki | |
| 2012/0061664 A1 | 3/2012 | Yamazaki et al. | |
| 2012/0061665 A1 | 3/2012 | Miyake et al. | |
| 2012/0061673 A1 | 3/2012 | Yamazaki et al. | |
| 2012/0062813 A1 | 3/2012 | Koyama | |
| 2012/0062814 A1 | 3/2012 | Yamazaki et al. | |
| 2012/0064650 A1 | 3/2012 | Yamazaki et al. | |

(56) References Cited

U.S. PATENT DOCUMENTS

| | | | |
|---|---|---|---|
| 2012/0119205 | A1 | 5/2012 | Taniguchi et al. |
| 2013/0214324 | A1 | 8/2013 | Takayama et al. |
| 2013/0242223 | A1 | 9/2013 | Ishitani et al. |

FOREIGN PATENT DOCUMENTS

| | | | |
|---|---|---|---|
| CN | 101750820 A | | 6/2010 |
| EP | 1 737 044 A1 | | 12/2006 |
| EP | 2192437 A | | 6/2010 |
| EP | 2 226 847 A2 | | 9/2010 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-203987 A | | 8/1993 |
| JP | 05-251705 A | | 9/1993 |
| JP | 08-264794 A | | 10/1996 |
| JP | 11-505377 A | | 5/1999 |
| JP | 2000-044236 A | | 2/2000 |
| JP | 2000-150900 A | | 5/2000 |
| JP | 2000-154058 A | | 6/2000 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2003-179069 A | | 6/2003 |
| JP | 2004-103957 A | | 4/2004 |
| JP | 2004-273614 A | | 9/2004 |
| JP | 2004-273732 A | | 9/2004 |
| JP | 2005-122182 A | | 5/2005 |
| JP | 2005-346091 A | | 12/2005 |
| JP | 2009-231613 A | | 10/2009 |
| JP | 2010-016347 A | | 1/2010 |
| JP | 4415062 B1 | | 2/2010 |
| JP | 2010-067954 A | | 3/2010 |
| JP | 2010-109359 A | | 5/2010 |
| JP | 2010-134466 A | | 6/2010 |
| JP | 2010-177431 A | | 8/2010 |
| JP | 4571221 B1 | | 10/2010 |
| JP | 2012-160679 A | | 8/2012 |
| WO | WO 2004/114391 A1 | | 12/2004 |
| WO | WO 2008/133345 A1 | | 11/2008 |

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kamiya, T et al., "Carrier transport properties and electronic structures of amorphous oxide semiconductors: the present status," Solid State Physics, Sep. 1, 2009, vol. 44, No. 9, pp. 621-633, Agne Gijutsu Center (with full English translation).

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, p. 21-008 (with full English translation).

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-2.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kamiya, T et al., "Carrier Transport Properties and Electronic Structures of Amorphous Oxide Semiconductors: The Present Status," Solid State Physics, Agne Gijutsu Center, Sep. 1, 2009, vol. 44, No. 9, pp. 621-633 with full English translation.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Chinese Office Action (Application No. 201110283656.5) Dated Jul. 20, 2015.

Chinese Office Action (Application No. 201110283656.5) Dated Feb. 13, 2015.

Chinese Office Action (Application No. 201110283656.5) Dated Jan. 14, 2016.

\* cited by examiner

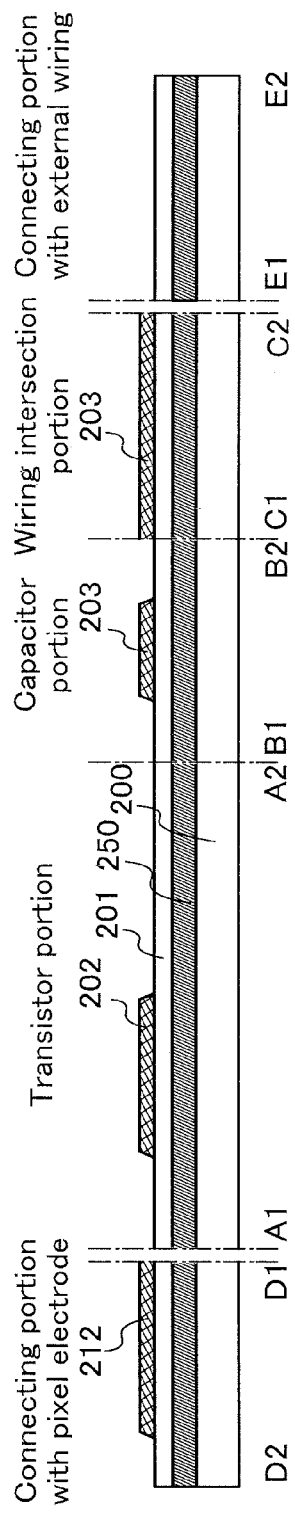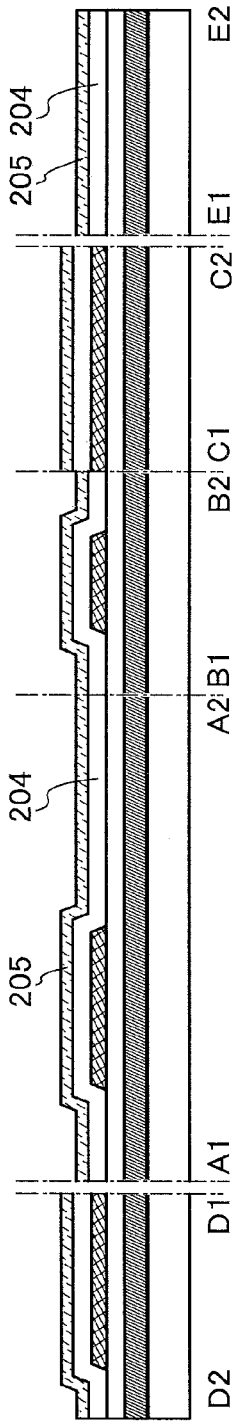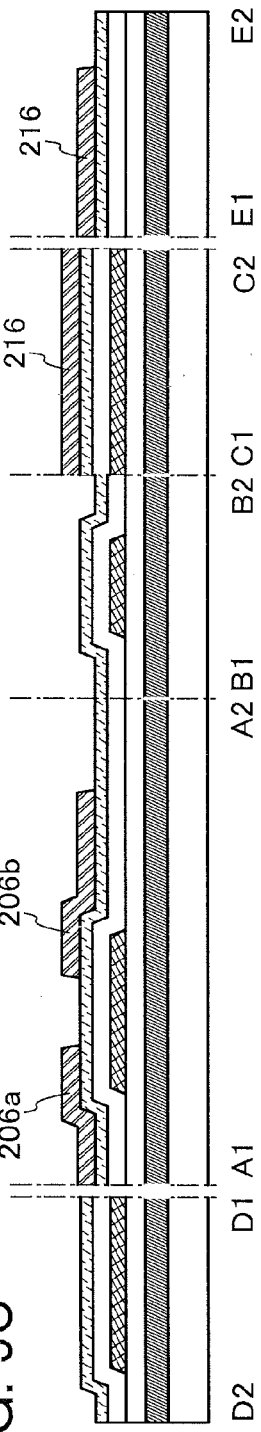

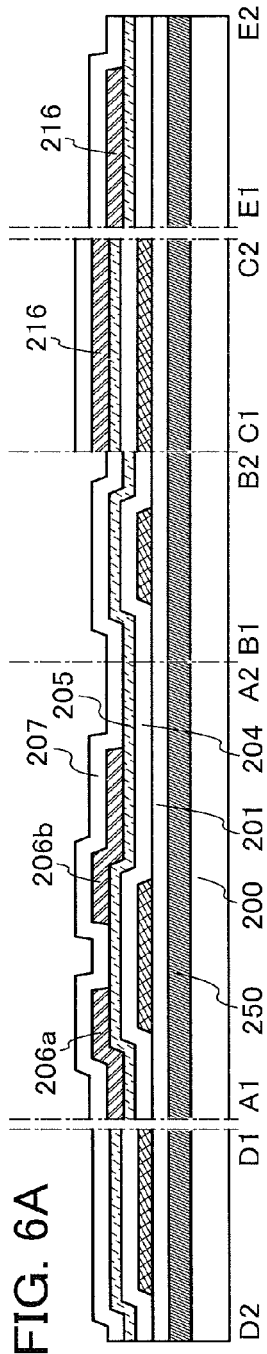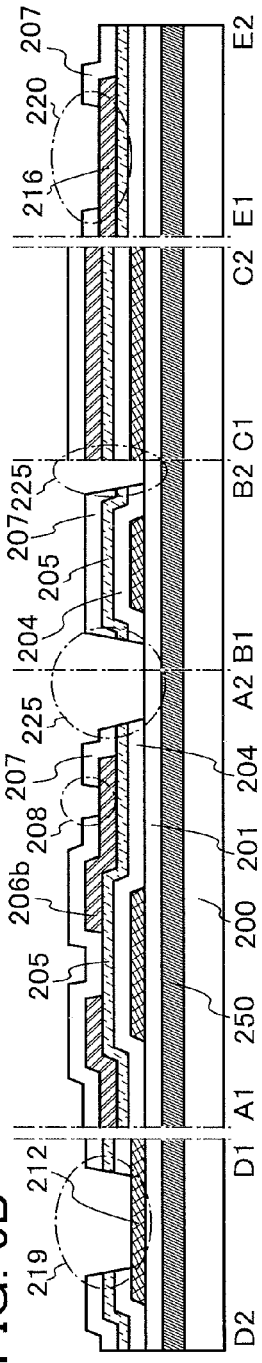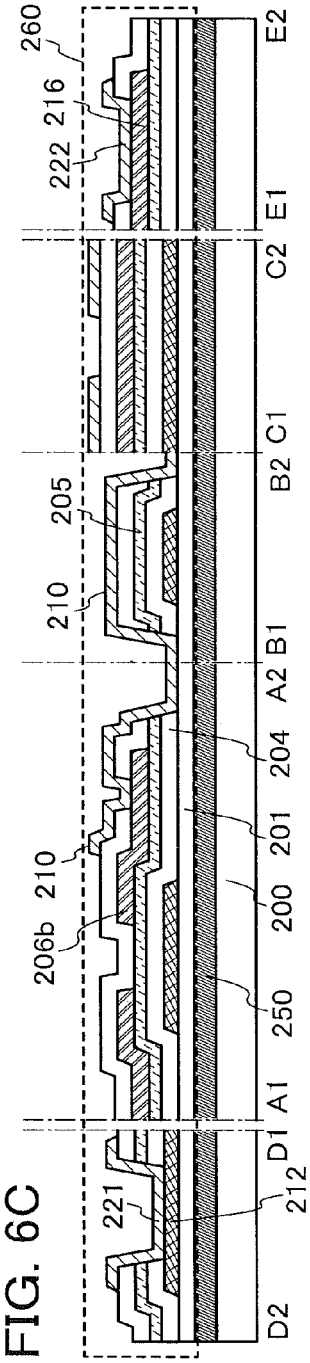

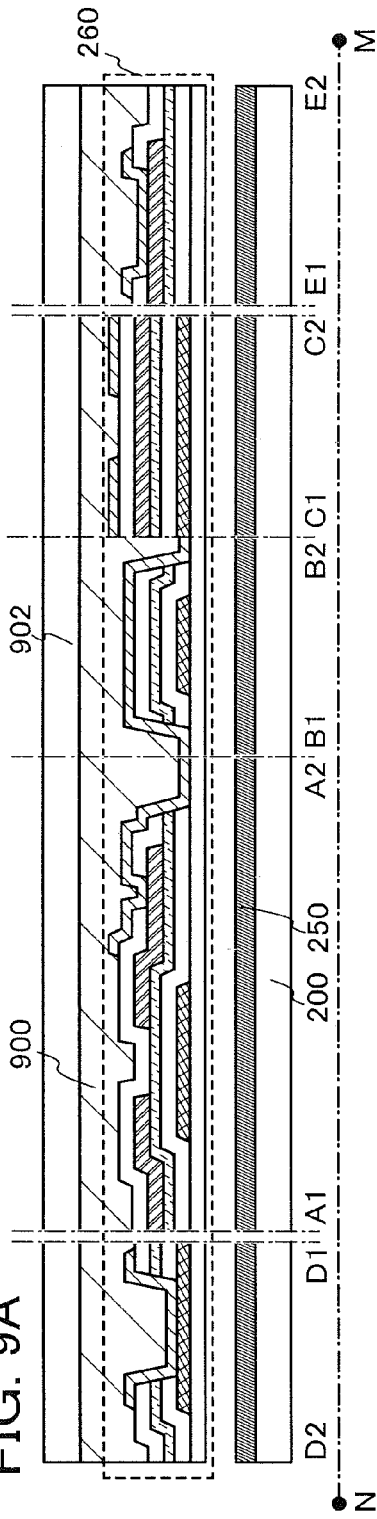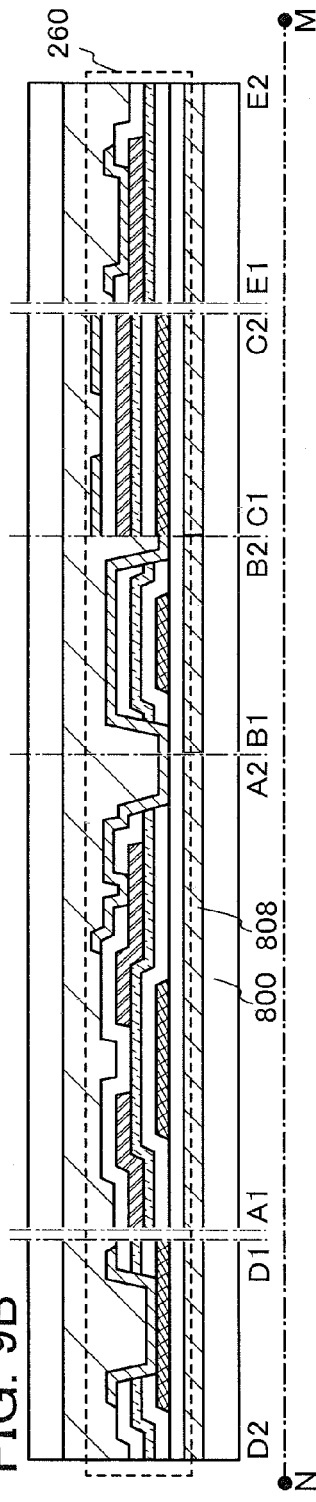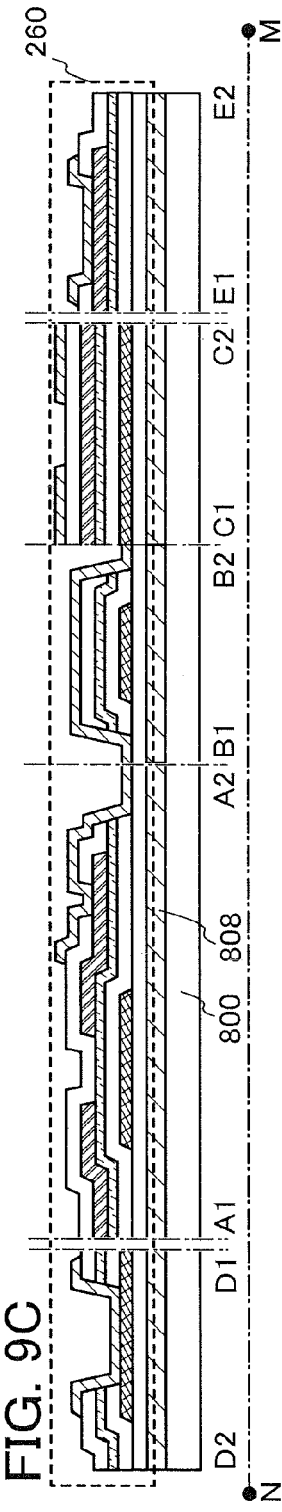

LIQUID CRYSTAL DISPLAY DEVICE AND METHOD FOR MANUFACTURING THE SAME

CROSS-REFERENCE TO RELATED APPLICATIONS

This application is a continuation of U.S. application Ser. No. 13/227,092, filed Sep. 7, 2011, now allowed, which claims the benefit of a foreign priority application filed in Japan as Serial No. 2010-204930 on Sep. 13, 2010, both of which are incorporated by reference.

BACKGROUND OF THE INVENTION

1. Field of the Invention

The present invention relates to a method for manufacturing a thin film transistor and a liquid crystal display device.

2. Description of the Related Art

In recent years, reduction in cost, thickness, and weight of liquid crystal display devices has been greatly needed.

As one of methods for achieving cost reduction of liquid crystal display devices, simplification of a manufacturing process of liquid crystal display devices can be given.

Driving methods of liquid crystal display devices are broadly classified into a passive matrix method and an active matrix method. In recent years, active matrix liquid crystal display devices which are excellent in image quality and high-speed response have been in the mainstream.

In an active matrix liquid crystal display device, each pixel is provided with a switching element. As the switching element, a thin film transistor is mainly used. As such a thin film transistor, a top-gate transistor whose channel formation region is provided below a gate electrode and a bottom-gate transistor whose channel formation region is provided over a gate electrode are given. These thin film transistors are generally manufactured using at least five photomasks.

Reducing the number of photomasks as much as possible is one of important factors to manufacture liquid crystal display devices at lower cost. In order to reduce the number of photomasks, a complicated technique such as backside light exposure (for example, see Patent Document 1), resist reflow, or a lift-off method, which requires a special apparatus, is used in many cases. The use of such a complicated technique might lead to various problems such as reduction in yield of liquid crystal display devices and degradation of electric characteristics of thin film transistors.

Further, as one of methods for achieving reduction in thickness and weight of liquid crystal display devices, reducing the thicknesses of substrates between which a liquid crystal material is sandwiched, by mechanical polishing, chemical polishing, or the like, are given.

Mainly, glass substrates are used as substrates between which a liquid crystal material is sandwiched and thus, there is a limit on reduction in thicknesses of such substrates by mechanical polishing, chemical polishing, or the like. Moreover, there is a problem that as the thicknesses of such substrates are reduced, the strength of the substrates is lowered and a liquid crystal display device is more likely to be damaged by external impact. Therefore, it is ideal to manufacture a liquid crystal display device with the use of significantly tough supports (such as a resin film and a metal film) as substrates between which a liquid crystal material is sandwiched.

REFERENCE

[Patent Document 1] Japanese Published Patent Application No. H05-203987

SUMMARY OF THE INVENTION

The present invention is made in view of the foregoing technical background. Thus, an object of one embodiment of the present invention is to reduce the number of photomasks as compared to that in the conventional case, without a complicated technique or a special apparatus. Another object of one embodiment of the present invention is to provide a method for manufacturing a liquid crystal display device which is thin, lightweight, and less prone to fracture.

That is to say, one embodiment of the present invention is a method for manufacturing a liquid crystal display device, which includes the steps of: forming a separation layer over a substrate; forming a first conductive layer over the separation layer; forming a first resist mask over the first conductive layer; partly removing the first conductive layer with the use of the first resist mask to form a gate electrode; forming a first insulating layer to be a gate insulating layer over the gate electrode; forming a semiconductor layer over the first insulating layer; forming a second conductive layer over the semiconductor layer; forming a second resist mask over the second conductive layer; partly removing the second conductive layer with the use of the second resist mask to form a source electrode and a drain electrode, so that a transistor including the gate electrode, the source electrode, and the drain electrode is manufactured; forming a second insulating layer serving as a protective insulating layer so that the second insulating layer covers the source electrode, the drain electrode, and the semiconductor layer; forming a third resist mask over the second insulating layer; selectively removing part of the second insulating layer overlapping with the drain electrode, with the use of the third resist mask, to form a first opening and at the same time, removing part of the second insulating layer, part of the semiconductor layer, and part of the first insulating layer, which do not overlap with the source electrode or the drain electrode, with the use of the third resist mask, to form a second opening; forming a third conductive layer so that the third conductive layer covers the first opening, the second opening, and the second insulating layer; forming a fourth resist mask over the third conductive layer; and partly removing the third conductive layer with the use of the fourth resist mask to form a pixel electrode.

According to the embodiment of the present invention, the step of forming the first opening serving as a contact hole and the step of etching the semiconductor layer are performed at the same time, whereby the thin film transistor can be manufactured using a smaller number of photomasks than those used in the conventional case and further, the layers including the thin film transistor can be separated from the substrate.

In a method for manufacturing a liquid crystal display device, according to one embodiment of the present invention, a base layer is formed over a substrate and in contact with a separation layer.

According to the embodiment of the present invention, diffusion of an impurity element from the substrate can be suppressed. Accordingly, a change in characteristics of a thin film transistor due to diffusion of an impurity element to a semiconductor layer can be suppressed.

In a method for manufacturing a liquid crystal display device, according to one embodiment of the present invention, a side surface of a semiconductor layer (a side surface of an end portion of a semiconductor layer) is covered with a pixel electrode.

According to the embodiment of the present invention, entry of impurities from the outside can be suppressed. Thus, a change in characteristics of a thin film transistor due to entry of impurities from the outside can be suppressed.

In a method for manufacturing a liquid crystal display device, according to one embodiment of the present invention, a semiconductor layer includes an oxide semiconductor.

According to the embodiment of the present invention, a highly reliable liquid crystal display device with low power consumption can be realized by using an oxide semiconductor as a semiconductor layer.

In a method for manufacturing a liquid crystal display device, according to one embodiment of the present invention, heat treatment is performed on an oxide semiconductor.

According to the embodiment of the present invention, the concentration of impurities such as moisture and hydrogen serving as electron donors (donors) of a semiconductor layer can be sufficiently reduced. Accordingly, the off-state current of a transistor can be reduced.

As to an oxide semiconductor in which impurities such as moisture and hydrogen serving as electron donors (donors) are reduced (purified OS), the hydrogen concentration measured by secondary ion mass spectrometry (SIMS) is $5 \times 10^{19}/\text{cm}^3$ or less, preferably $5 \times 10^{18}/\text{cm}^3$ or less, more preferably $5 \times 10^{17}/\text{cm}^3$ or less, and still more preferably $1 \times 10^{16}/\text{cm}^3$ or less. Furthermore, the band gap of the oxide semiconductor is 2 eV or more, preferably 2.5 eV or more, more preferably 3 eV or more.

The SIMS analysis of the hydrogen concentration in the oxide semiconductor is described here. Because of the principle of the SIMS analysis, it is known to be difficult to obtain accurate data in the proximity of a surface of a sample or in the proximity of an interface between stacked films formed of different materials. Therefore, when a hydrogen concentration of the film is analyzed by SIMS, the average value in a region in which the values do not extremely vary and are substantially constant is employed as the hydrogen concentration. Further, in the case where the thickness of the film is small, a region where a constant value can be obtained cannot be found in some cases due to the influence of the hydrogen in the films adjacent to each other. In this case, the maximum value or the minimum value of the hydrogen concentration is employed as the hydrogen concentration in the film. Furthermore, in the case where a maximum peak and a minimum valley do not exist, the value of the inflection point is employed as the hydrogen concentration.

In a method for manufacturing a liquid crystal display device, according to one embodiment of the present invention, a first conductive layer and a second conductive layer are each formed using a material containing copper.

According to the embodiment of the present invention, the use of a material containing copper for formation of a gate electrode, a source electrode, a drain electrode, or a wiring connected to these electrodes allows reduction in wiring resistance, so that signal delay can be prevented.

In a method for manufacturing a liquid crystal display device, according to one embodiment of the present invention, the upper limit of the process temperature at the time after formation of a first conductive layer and a second conductive layer is lower than or equal to 450° C.

According to the embodiment of the present invention, when a material containing copper is used for formation of a gate electrode, a source electrode, a drain electrode, or a wiring connected to these electrodes, the electrodes and the wiring are not deformed, and elution of a component in the electrodes and the wiring due to a thermal factor does not occur. Therefore, a highly reliable liquid crystal display device can be manufactured.

In a method for manufacturing a liquid crystal display device, according to one embodiment of the present invention, a first conductive layer and a second conductive layer are each formed using a material containing aluminum.

According to the embodiment of the present invention, the use of a material containing aluminum for formation of a gate electrode, a source electrode, a drain electrode, or a wiring connected to these electrodes allows reduction in wiring resistance, so that signal delay can be prevented.

In a method for manufacturing a liquid crystal display device, according to one embodiment of the present invention, the upper limit of the process temperature at the time after formation of a first conductive layer and a second conductive layer is lower than or equal to 380° C.

According to the embodiment of the present invention, when a material containing aluminum is used for formation of a gate electrode, a source electrode, a drain electrode, or a wiring connected to these electrodes, the electrode and the wiring are not deformed, and elution of a component in the electrodes and the wiring due to a thermal factor does not occur. Therefore, a highly reliable liquid crystal display device can be manufactured.

A method for manufacturing a liquid crystal display device, according to one embodiment of the present invention, includes: a step of forming an element region including at least a gate electrode, a first insulating layer, a semiconductor layer, a source electrode, a drain electrode, a second insulating layer, and a pixel electrode, over a substrate with a separation layer interposed therebetween, which is followed by a step of forming a protective layer so that the protective layer covers a surface of the element region; a step of separating the protective layer and the element region from the substrate; a step of bonding a first support whose fracture toughness is greater than or equal to 1.5 $[\text{MPa} \cdot \text{m}^{1/2}]$ to the other surface of the element region; a step of removing the protective layer from the first support; forming a fourth conductive layer over a surface of a second support whose fracture toughness is greater than or equal to 1.5 $[\text{MPa} \cdot \text{m}^{1/2}]$; and providing a liquid crystal material between the surface of the first support, over which the element region is provided, and the surface of the second support, over which the fourth conductive layer is provided.

According to the embodiment of the present invention, the element region provided over the substrate can be transferred to the first support whose fracture toughness is greater than or equal to 1.5 $[\text{MPa} \cdot \text{m}^{1/2}]$. Further, the second support with which a liquid crystal material is sandwiched also has a fracture toughness of greater than or equal to 1.5 $[\text{MPa} \cdot \text{m}^{1/2}]$. Thus, a liquid crystal display device which is thin, lightweight, and less prone to fracture can be manufactured.

A semiconductor device in this specification refers to any device that can function by utilizing semiconductor characteristics. A semiconductor circuit, a storage device, an imaging device, a display device, an electro-optical device, an electronic device, and the like are all semiconductor devices.

When "B is formed on A" or "B is formed over A" is explicitly described in this specification, it does not necessarily mean that B is formed in direct contact with A. The expression includes the case where A and B are not in direct contact with each other, i.e., the case where another object is interposed between A and B. Here, each of A and B corresponds to an object (e.g., a device, an element, a circuit, a wiring, an electrode, a terminal, a film, a layer, or a substrate).

Therefore, for example, when it is explicitly described that a layer B is formed on or over a layer A, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., the layer C or the layer D) may be a single layer or a plurality of layers.

In this specification, ordinal numbers such as "first", "second", and "third" are used in order to avoid confusion among components, and the terms do not mean the number of components.

A "transistor" in this specification is a kind of semiconductor elements and can perform amplification of current or voltage, switching operation for controlling conduction or non-conduction, or the like. A "transistor" in this specification includes an insulated-gate field effect transistor (IGFET) and a thin film transistor (TFT).

Functions of a "source" and a "drain" of a transistor in this specification are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification, the term of "electrode" or "wiring" does not limit the function of component. For example, an "electrode" is sometimes used as part of a "wiring", and vice versa. Furthermore, the term "electrode" or "wiring" can include the case where a plurality of "electrodes" or "wirings" is formed in an integrated manner.

The term "toughness" in this specification represents the resistance of a material to fracture. The fracture is less prone to progress even in the case where a heavy load is applied or strong impact is made as a material has higher toughness, and the fracture is less prone to progress when a flaw produced in part of a substrate acts as a starting point, for example. The level of the toughness can be expressed in the fracture toughness Kc. Note that the fracture toughness Kc can be determined by a test method defined in JIS R1607.

According to one embodiment of the present invention, the number of photomasks can be reduced as compared to the conventional case without using a complicated technique or a special apparatus. Further, a method for manufacturing a liquid crystal display device which is thin, lightweight, and significantly tough can be provided.

BRIEF DESCRIPTION OF THE DRAWINGS

In the accompanying drawings:

FIGS. 5A to 5C are cross-sectional process views illustrating one embodiment of the present invention;

FIGS. 6A to 6C are cross-sectional process views illustrating the one embodiment of the present invention;

FIGS. 9A to 9C are cross-sectional process views illustrating one embodiment of the present invention;

DETAILED DESCRIPTION OF THE INVENTION

Figure 1A:
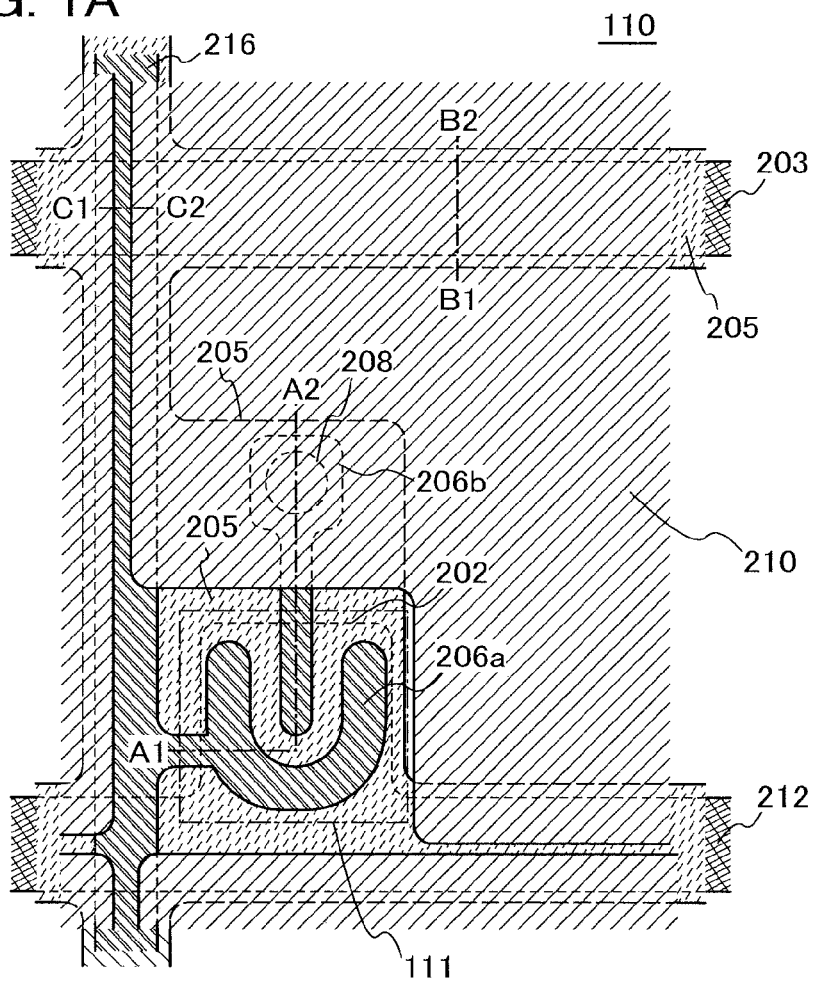
FIGS. 1A and 1B are a top view and a cross-sectional view illustrating one embodiment of the present invention.

Embodiments will be described in detail with reference to the drawings. Note that the present invention is not limited to the following description, and it is easily understood by those skilled in the art that modes and details of the present invention can be modified in a variety of ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a structural example of a pixel portion included in a liquid crystal display device according to one embodiment of the present invention will be described with reference to FIGS. 1A to 6C.

Figure 3A:
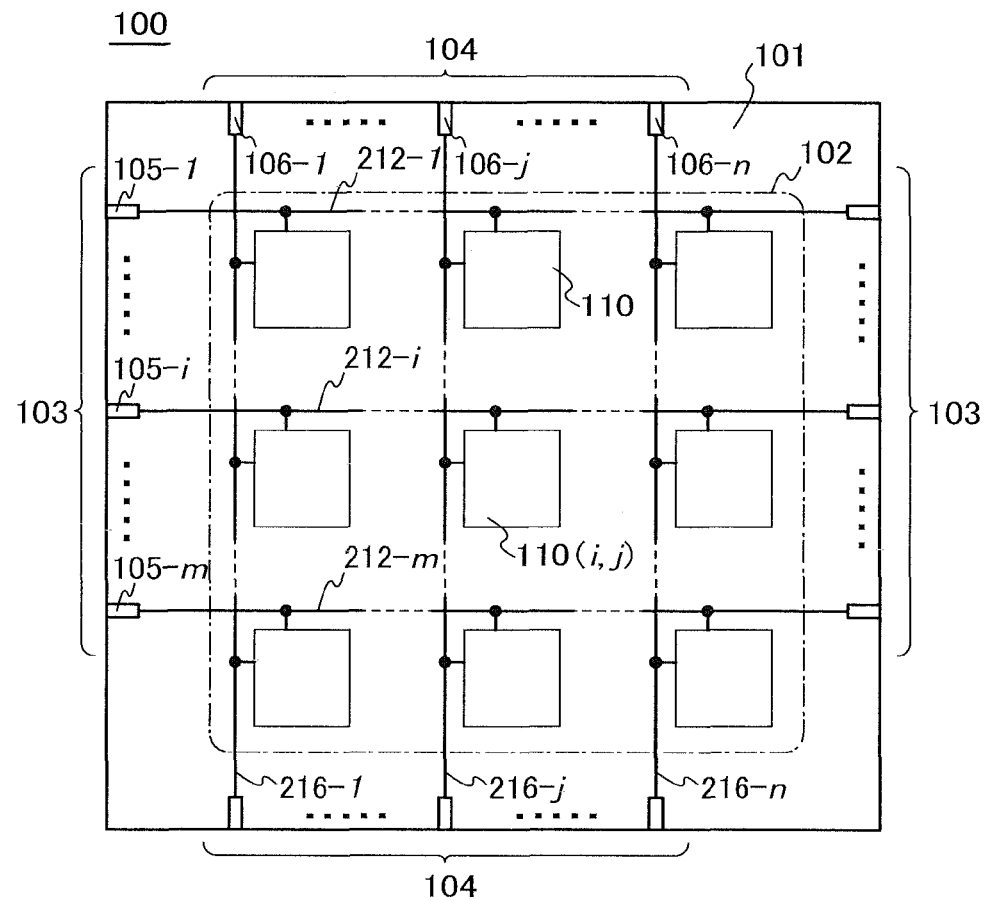
FIGS. 3A and 3B are circuit diagrams illustrating one embodiment of the present invention.

FIG. 3A shows a structure example of a semiconductor device 100 used in a liquid crystal display device. The semiconductor device 100 includes, over a substrate 101, a pixel region 102, a terminal portion 103 including m (m is an integer greater than or equal to 1) terminals 105, and a terminal portion 104 including n (n is an integer greater than or equal to 1) terminals 106. The semiconductor device 100 also includes m wirings 212 electrically connected to the terminal portion 103, and n wirings 216 electrically connected to the terminal portion 104. The pixel region 102 includes a plurality of pixels 110 arranged in matrix of m rows (in the longitudinal direction)×n columns (in the transverse direction). The pixel 110 $(i,j)$ (i is an integer greater than or equal to 1 and less than or equal to m, and j is an integer greater than or equal to 1 and less than or equal to n) in the i-th row and the j-th column is electrically connected to a wiring 212-$i$ and a wiring 216-$j$. The wiring 212-$i$ is electrically connected to a terminal 105-$i$, and the wiring 216-$j$ is electrically connected to a terminal 106-$j$.

The terminal portion 103 and the terminal portion 104 are external input terminals, and connected to a control circuit provided externally, through a flexible printed circuit (FPC) or the like. Signals supplied from the control circuit provided externally are input to the semiconductor device 100 through the terminal portions 103 and the terminal portions 104. In FIG. 3A, the terminal portions 103 are provided on the right external side and the left external side of the pixel region 102, and signals are input from the two portions. The terminal portions 104 are provided on the upper external side and the lower external side of the pixel region 102, and signals are input from the two portions. The signal supply capability is increased by the input of signals from the two portions; thus, high-speed operation of the semiconductor device 100 can be easily achieved. Moreover, the influence of signal delay due to increase in wiring resistance, which is caused by increase in size or in definition of the semiconductor device 100, can be reduced. Further, the semiconductor device 100 can have redundancy, so that the reliability of the semiconductor device 100 can be increased. Note that although FIG. 3A shows the structure in which two terminal portions 103 and two terminal portions 104 are provided, a structure may be employed in which one terminal portion 103 and one terminal portion 104 are provided.

Figure 3B:
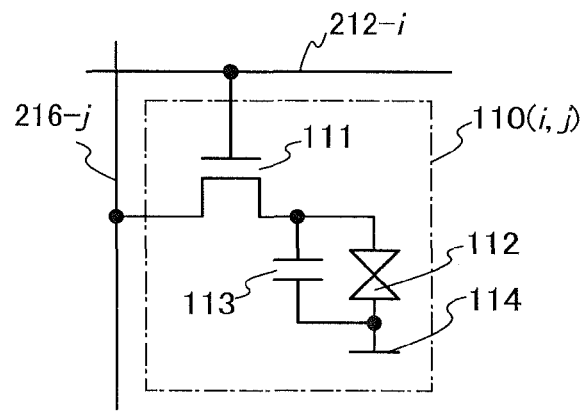

FIG. 3B shows a circuit configuration of the pixel 110. The pixel 110 includes a transistor 111, a liquid crystal element 112, and a capacitor 113. A gate electrode of the transistor 111 is electrically connected to the wiring 212-$i$, and one of a source electrode and a drain electrode of the transistor 111 is electrically connected to the wiring 216-$j$. The other of the source electrode and the drain electrode of the transistor 111 is electrically connected to one electrode of the liquid crystal element 112 and one electrode of the capacitor 113. The other electrode of the liquid crystal element 112 and the other electrode of the capacitor 113 are electrically connected to an electrode 114. The potential of the electrode 114 may be a fixed potential, e.g., 0V, GND, or a common potential.

The transistor 111 has a function of determining whether an image signal supplied from the wiring 216-$j$ is input to the liquid crystal element 112 or not. When a signal for turning on the transistor 111 is supplied to the wiring 212-$i$, an image signal from the wiring 216-$j$ is supplied to the liquid crystal element 112 through the transistor 111. The light transmittance of the liquid crystal element 112 is controlled depending on the supplied image signal (potential). The capacitor 113 serves as a storage capacitor (also referred to as a Cs capacitor) for keeping the potential supplied to the liquid crystal element 112. Although the capacitor 113 is not necessarily provided, when the capacitor 113 is provided, variation in the potential applied to the liquid crystal element 112, which is caused by current (off-state current) flowing between the source electrode and the drain electrode when the transistor 111 is off, can be suppressed.

The capacitance of a storage capacitor provided in a liquid crystal display device is set in consideration of leakage current or the like of a transistor provided in a pixel portion so that charge can be held for a predetermined period. When the transistor having a highly purified oxide semiconductor is used for a semiconductor layer in which a channel region is formed, it is enough to provide a storage capacitor having capacitance that is less than or equal to 1/3, preferably less than or equal to 1/5 of liquid crystal capacitance of each pixel.

A single crystal semiconductor, a polycrystalline semiconductor, a microcrystalline semiconductor, an amorphous semiconductor, or the like can be used as a semiconductor for forming a channel of the transistor 111. Examples of a semiconductor material include silicon, germanium, silicon germanium, silicon carbide, and gallium arsenide.

Alternatively, an oxide semiconductor may be used as a semiconductor for forming the channel of the transistor 111. The oxide semiconductor may be either a single crystal oxide semiconductor or a non-single-crystal oxide semiconductor. In the latter case, the non-single-crystal oxide semiconductor may be amorphous, microcrystalline (nanocrytalline), or polycrystalline. Further, the oxide semiconductor may have either an amorphous structure including a portion having crystallinity or a non-amorphous structure without a portion having crystallinity. An amorphous oxide semiconductor can be formed by sputtering with the use of an oxide semiconductor target. A crystalline oxide semiconductor can be formed while a substrate is heated to a temperature higher than or equal to room temperature in sputtering. As the oxide semiconductor, an oxide semiconductor whose crystallographic axes are aligned can be used as described in Embodiment 2.

An oxide semiconductor has a wide energy gap of 3.0 eV or more. In a transistor having an oxide semiconductor prepared under appropriate conditions, the off-state current can be lower than or equal to 100 zA ($1 \times 10^{-19}$ A), further, lower than or equal to 10 zA ($1 \times 10^{-20}$ A), furthermore, lower than or equal to 1 zA ($1 \times 10^{-21}$ A) at an operating temperature (e.g., at 25° C.).

Thus, the use of an oxide semiconductor for a semiconductor layer of the transistor 111 in which a channel is formed allows the reduction of the current value in an off state (off-state current value). Accordingly, the retention time of an electric signal such as an image signal can be increased, and the signal can be held for a long time even if additional writing is not carried out. Therefore, the frequency of refresh operation can be reduced, which contributes to the reduction of power consumption. Further, the transistor 111 in which an oxide semiconductor is used for a semiconductor layer can hold a potential supplied to a liquid crystal element, even when a storage capacitor is not provided.

The transistor where an oxide semiconductor is used for a semiconductor layer in which a channel is formed has a relatively high field-effect mobility, so that high-speed operation is possible. Therefore, by using such a transistor in a pixel portion of a liquid crystal display device, a high-quality image can be provided. In addition, since such a transistor can be provided in each of a driver circuit portion and a pixel portion which are provided over one substrate, the number of components of a liquid crystal display device can be reduced.

Figure 1B:
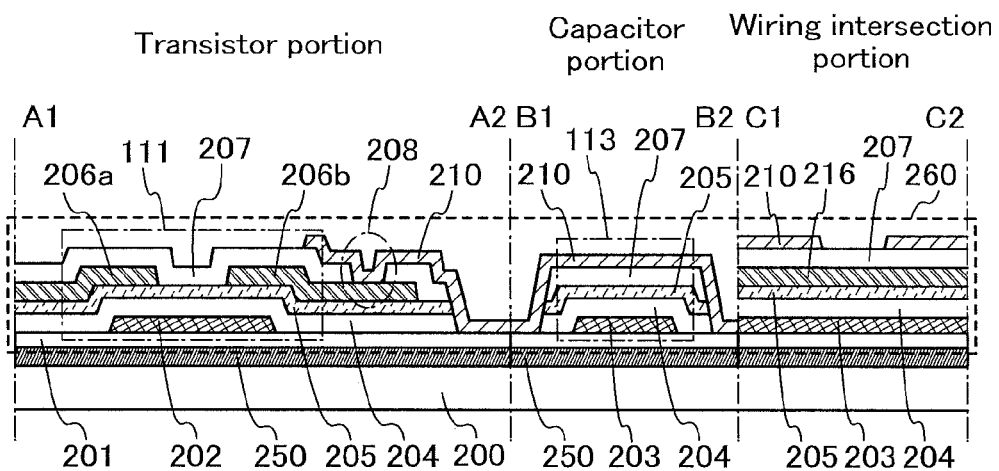

Next, a structure example of the pixel 110 illustrated in FIGS. 3A and 3B will be described with reference to FIGS. 1A and 1B. FIG. 1A is a top view illustrating a plan structure of the pixel 110, and FIG. 1B is a cross-sectional view illustrating a layered structure of the pixel 110. Note that dashed-dotted lines A1-A2, B1-B2, and C1-C2 in FIG. 1A correspond to cross sections A1-A2, B1-B2, and C1-C2 in FIG. 1B, respectively.

In the transistor 111 described in this embodiment, a drain electrode 206$b$ is partly surrounded by a U-shaped (C-shaped, reversed C-shaped, or horseshoe-shaped) source electrode 206$a$. With the source electrode having such a shape, a channel width can be sufficiently secured even when the area of a transistor is small; thus, the amount of current flowing during an on state of the transistor (also referred to as an on-state current) can be increased.

When the parasitic capacitance between a gate electrode 202 and the drain electrode 206$b$ electrically connected to a pixel electrode 210 is large, influence due to feedthrough is readily gained; therefore, the potential supplied to the liquid crystal element 112 cannot be kept accurately, which may deteriorate the display quality. As described in this embodiment, with the structure in which the drain electrode 206$b$ is partly surrounded by the U-shaped source electrode 206$a$, a channel width can be sufficiently secured and the parasitic capacitance between the drain electrode 206$b$ and the gate electrode 202 can be small; whereby the display quality of the liquid crystal display device can be improved.

In the cross section A1-A2 of FIG. 1B, a layered structure of the transistor 111 is illustrated. The transistor 111 is a bottom-gate transistor. In the cross section B1-B2 of FIG. 1B, a layered structure of the capacitor 113 is illustrated. In the cross section C1-C2, a layered structure in a wiring intersection portion of a capacitor wiring 203 and the wiring 216 is illustrated.

In the cross section A1-A2, a separation layer 250 is formed over a substrate 200, a base layer 201 is formed over the separation layer 250, and a gate electrode 202 is formed over the base layer 201. Over the gate electrode 202, a first insulating layer 204 and a semiconductor layer 205 are formed. Further, the source electrode 206a and the drain electrode 206b are formed over the semiconductor layer 205. Over the source electrode 206a and the drain electrode 206b, a second insulating layer 207 is formed in contact with part of the semiconductor layer 205. The pixel electrode 210 is formed over the second insulating layer 207, and electrically connected to the drain electrode 206b through a contact hole 208 formed in the second insulating layer 207.

Part of the first insulating layer 204, part of the semiconductor layer 205, and part of the second insulating layer 207 are removed, and the pixel electrode 210 is formed in contact with the first insulating layer 204, the semiconductor layer 205, and the second insulating layer 207. In this embodiment, an oxide semiconductor in which the carrier concentration is significantly reduced (also referred to as an i-type (intrinsic) or substantially i-type oxide semiconductor) is used for the semiconductor layer 205. The oxide semiconductor can be substantially regarded as an insulator in the off state. Therefore, even if the pixel electrode 210 is in contact with a side surface of an end portion of the semiconductor layer 205, a problem such as leakage current does not occur.

Further, since the side surface of the end portion of the semiconductor layer 205 are covered with the pixel electrode 210, impurities from the outside such as hydrogen, water, a compound having a hydroxyl group, a hydride, an alkali metal (e.g., sodium, lithium, and potassium), and an alkaline earth metal can be prevented from reaching the semiconductor layer 205 and adversely affecting electric characteristics and reliability of the transistor.

In the cross section B1-B2, the separation layer 250 is formed over the substrate 200, the base layer 201 is formed over the separation layer 250, and the capacitor wiring 203 is formed over the base layer 201. The first insulating layer 204 and the semiconductor layer 205 are formed over the capacitor wiring 203, and the second insulating layer 207 is formed over the semiconductor layer 205. Further, over the second insulating layer 207, the pixel electrode 210 is formed.

A portion where the capacitor wiring 203 and the pixel electrode 210 overlap with each other with the first insulating layer 204, the semiconductor layer 205, and the second insulating layer 207 interposed therebetween functions as the capacitor 113. The first insulating layer 204, the semiconductor layer 205, and the second insulating layer 207 function as dielectric layers. Since the dielectric layers formed between the capacitor wiring 203 and the pixel electrode 210 has a multi-layer structure, even when a pinhole is formed in one dielectric layer, the pinhole is covered with another dielectric layer; thus, the capacitor 113 can function normally. Further, the relative dielectric constant of an oxide semiconductor is higher than that of silicon oxide, silicon nitride, or the like generally used for an insulating film; thus, the capacitance of the capacitor 113 can be large by using an oxide semiconductor for the semiconductor layer 205.

In the cross section C1-C2, the separation layer 250 is formed over the substrate 200, the base layer 201 is formed over the separation layer 250, and the capacitor wiring 203 is formed over the base layer 201. The first insulating layer 204 and the semiconductor layer 205 are formed over the capacitor wiring 203. The wiring 216 is formed over the semiconductor layer 205, and the second insulating layer 207 and the pixel electrode 210 are formed over the wiring 216.

Note that in FIG. 1B, the layers formed over the separation layer 250 are hereinafter collectively referred to as an element region 260. The element region 260 includes at least the gate electrode 202, the first insulating layer 204, the semiconductor layer 205, the source electrode 206a, the drain electrode 206b, the second insulating layer 207, and the pixel electrode 210. The element region 260 may further include the base layer 201 and the wiring 216. Also, the element region 260 may include the wiring 212, an electrode 221, and an electrode 222 which are to be described later, and the like.

Figure 2A:
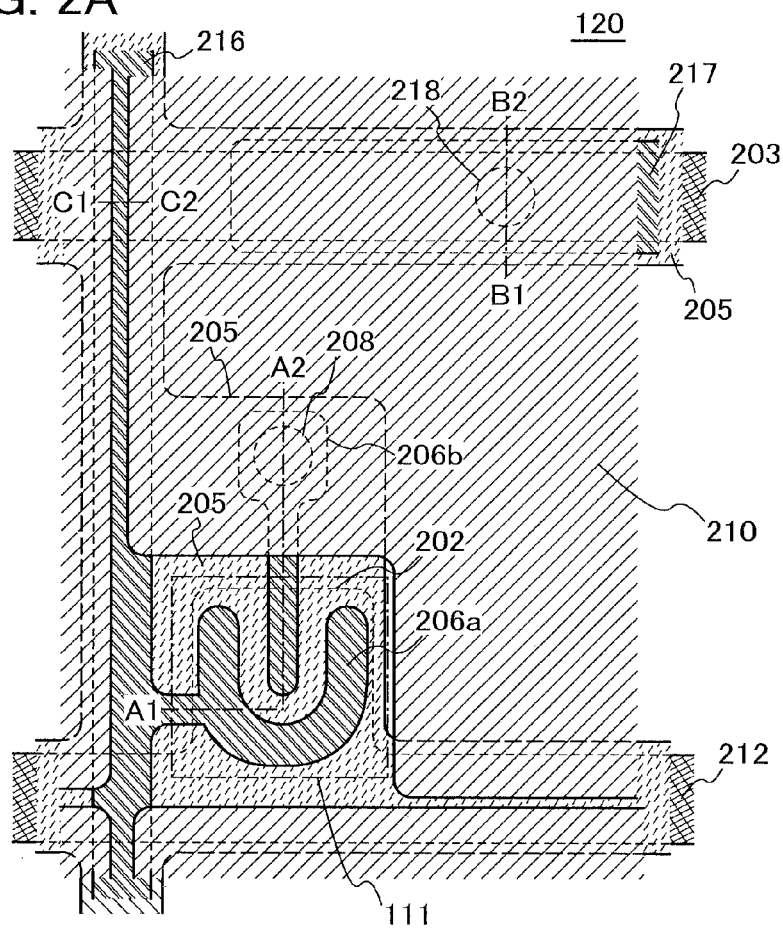
FIGS. 2A and 2B are a top view and a cross-sectional view illustrating one embodiment of the present invention.
Figure 2B:
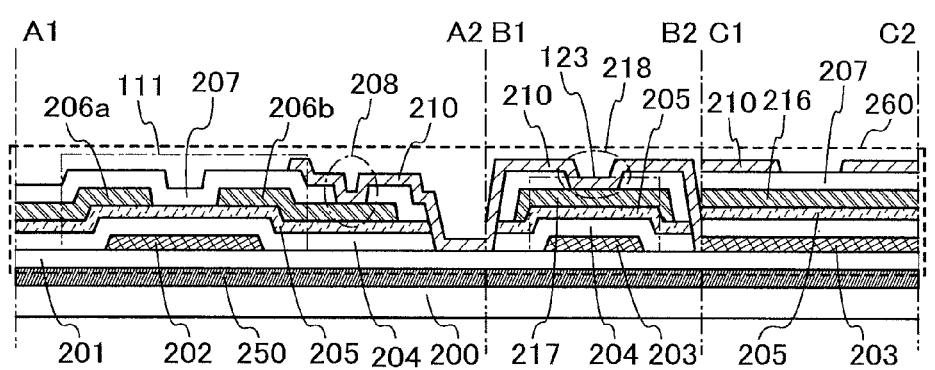

Next, a structure of a pixel having a capacitor different from that of the pixel 110 in FIGS. 1A and 1B will be described with reference to FIGS. 2A and 2B. FIG. 2A is a top view illustrating a plan structure of a pixel 120, and FIG. 2B is a cross-sectional view illustrating a layered structure of the pixel 120. Note that dashed-dotted lines A1-A2, B1-B2, and C 1-C2 in FIG. 2A correspond to cross sections A1-A2, B 1-B2, and C 1-C2 in FIG. 2B, respectively.

In the cross section B1-B2, the separation layer 250 is formed over the substrate 200, the base layer 201 is formed over the separation layer 250, and the capacitor wiring 203 is formed over the base layer 201. The first insulating layer 204 and the semiconductor layer 205 are formed over the capacitor wiring 203, and an electrode 217 is formed over the semiconductor layer 205. Further, the second insulating layer 207 is formed over the electrode 217, and the pixel electrode 210 is formed over the second insulating layer 207. The pixel electrode 210 is electrically connected to the electrode 217 through a contact hole 218 formed in the second insulating layer 207.

A portion where the capacitor wiring 203 and the electrode 217 overlap with each other with the first insulating layer 204 and the semiconductor layer 205 interposed therebetween functions as a capacitor 123. The thickness of dielectric layers which are formed between the capacitor wiring 203 and the electrode 217 in the capacitor 123 can be smaller than that in the capacitor 113 illustrated in FIG. 1B by the thickness of the second insulating layer 207. Thus, the capacitance of the capacitor 123 can be larger than that of the capacitor 113.

Note that in FIG. 2B, the layers formed over the separation layer 250 are hereinafter collectively referred to as the element region 260. The element region 260 includes at least the gate electrode 202, the first insulating layer 204, the semiconductor layer 205, the source electrode 206a, the drain electrode 206b, the second insulating layer 207, and the pixel electrode 210. The element region 260 may further include the base layer 201 and the wiring 216. Also, the element region 260 may include the wiring 212, the electrode 221, and the electrode 222 which are to be described later, and the like.

Figures 1, 4A:
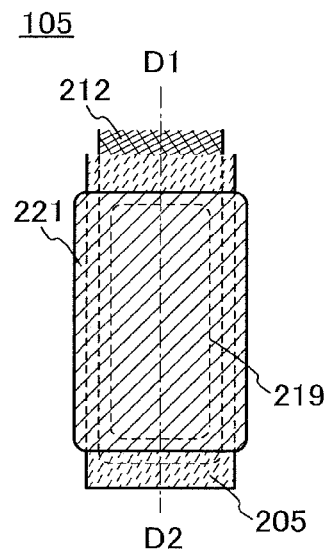
FIGS. 4A-1 and 4B-1 are top views illustrating embodiments of the present invention and FIGS. 4A-2 and 4B-2 are cross-sectional views illustrating the embodiments of the present invention.
Figures 2, 4A:
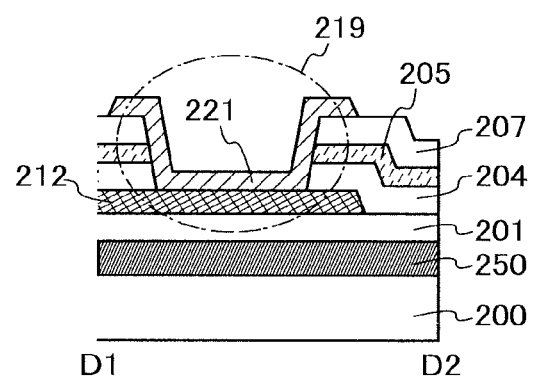
Figures 1, 4B:
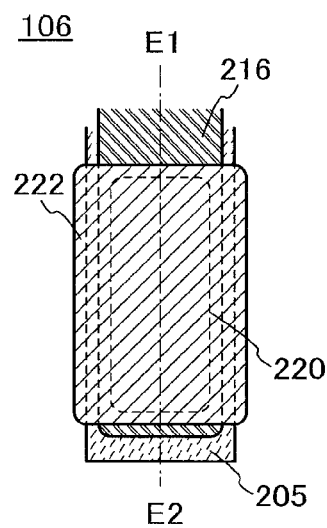
Figures 2, 4B:
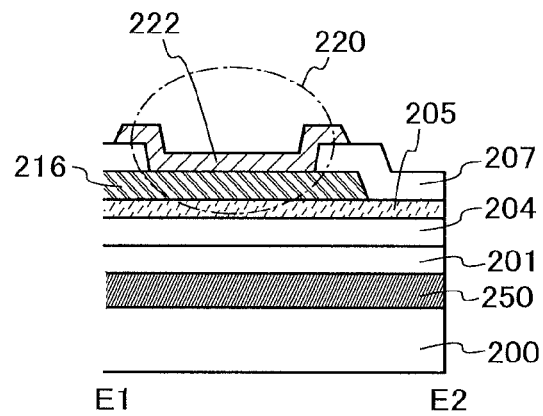

Next, structure examples of the terminal 105 and the terminal 106 will be described with reference to FIGS. 4A-1, 4A-2, 4B-1, and 4B-2. FIGS. 4A-1 and 4A-2 are a top view and a cross-sectional view illustrating the terminal 105, respectively. A dashed-dotted line D1-D2 in FIG. 4A-1 corresponds to a cross section D1-D2 in FIG. 4A-2. FIGS. 4B-1 and 4B-2 are a top view and a cross-sectional view illustrating the terminal 106, respectively. A dashed-dotted line E1-E2 in FIG. 4B-1 corresponds to a cross section E1-E2 in FIG. 4B-2.

In the cross section D1-D2, the separation layer 250 is formed over the substrate 200, the base layer 201 is formed over the separation layer 250, and the wiring 212 is formed over the base layer 201. The first insulating layer 204, the semiconductor layer 205, and the second insulating layer 207 are formed over the wiring 212. An electrode 221 is formed over the second insulating layer 207 and electrically connected to the wiring 212 through a contact hole 219 formed in the first insulating layer 204, the semiconductor layer 205, and the second insulating layer 207.

In the cross section E1-E2, the separation layer 250 is formed over the substrate 200, the base layer 201 is formed over the separation layer 250, the first insulating layer 204 is formed over the base layer 201, and the semiconductor layer 205 is formed over the first insulating layer 204. The wiring 216 is formed over the semiconductor layer 205, and the second insulating layer 207 is formed over the wiring 216. An electrode 222 is formed over the second insulating layer 207, and electrically connected to the wiring 216 through a contact hole 220 formed in the second insulating layer 207.

Next, a manufacturing method of the pixel portion in the liquid crystal display device described using FIGS. 1A and 1C will be described with reference to FIGS. 5A to 5C and FIGS. 6A to 6C. Note that cross sections A1-A2, B1-B2, and C1-C2 in FIGS. 5A to 5C and FIGS. 6A to 6C are cross-sectional views taken along the dashed-dotted lines A1-A2, B1-B2, and C1-C2 in FIG. 1A, respectively.

Note that in FIGS. 5A to 5C and FIGS. 6A to 6C, a cross section D1-D2 showing a layered structure of the terminal 105 and a cross section E1-E2 showing a layered structure of the terminal 106 are additionally illustrated. In the cross sections D1-D2 and E1-E2, each of D2 and E2 corresponds to an edge of the substrate.

First, the separation layer 250 is formed to a thickness of greater than or equal to 50 nm and less than or equal to 1000 nm, preferably greater than or equal to 100 nm and less than or equal to 500 nm, more preferably greater than or equal to 100 nm and less than or equal to 300 nm over the substrate 200.

The substrate 200 may be a glass substrate, a quartz substrate, a sapphire substrate, a ceramic substrate, a metal substrate, or the like. Note that such a substrate which is not thin enough to be definitely flexible enables precise formation of an element such as a transistor. "Not definitely flexible" means that the elastic modulus of the substrate is higher than or equivalent to that of a glass substrate used in generally fabricating a liquid crystal display. In this embodiment, aluminoborosilicate glass is used for the substrate 200.

The separation layer 250 is formed to have a single-layer or layered structure using any of elements selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), an alloy containing any of the above elements as its main component, and a compound containing any of the above elements as its main component by a sputtering method, a plasma CVD method, an application method, a printing method, or the like.

When the separation layer 250 has a single-layer structure, a layer containing tungsten, molybdenum, or a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 250 has a layered structure, it is preferable that a metal layer and a metal oxide layer be formed as a first layer and a second layer, respectively. Typically, it is preferable to form a tungsten layer, a molybdenum layer, or a layer containing mixture of tungsten and molybdenum as the first layer and to form an oxide, an oxynitride, or a nitride oxide of tungsten, molybdenum, or mixture of tungsten and molybdenum as the second layer.

When the metal oxide layer is formed as the second layer, an oxide layer (such as a silicon oxide which can be utilized as an insulating layer) may be formed on the metal layer as the first layer so that an oxide of the metal is formed on a surface of the metal layer.

It is also possible to use an amorphous silicon layer containing hydrogen, a layer containing nitrogen, oxygen, hydrogen, or the like (e.g., an amorphous silicon film containing hydrogen, an alloy film containing hydrogen, or an alloy film containing oxygen), or an organic resin, as the separation layer 250.

In this embodiment, a tungsten film with a thickness of 150 nm is used as the separation layer 250. Note that the tungsten film may be in a state where a surface thereof is oxidized (that is, in a state where a tungsten oxide film is formed over the surface of the tungsten film).

The separation layer 250 is a layer mainly for separation of a semiconductor device provided over the base layer 201 from the substrate 200 and further has a function of preventing diffusion of an impurity element from the substrate 200.

Next, over the separation layer 250, an insulating layer serving as the base layer 201 is formed to a thickness of greater than or equal to 50 nm and less than or equal to 300 nm, preferably greater than or equal to 100 nm and less than or equal to 200 nm.

The base layer 201 can be formed with a single-layer structure or a layered structure using at least one of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of an impurity element from the substrate 200 and the separation layer 250. Note that silicon nitride oxide in this specification contains oxygen and nitrogen so that the nitrogen content is higher than the oxygen content. It is preferred that in the case where measurements are performed using Rutherford backscattering spectrometry (RBS) and hydrogen forward scattering (HFS), silicon nitride oxide be estimated to have a composition of oxygen, nitrogen, silicon, and hydrogen at 5 at. % to 30 at. %, 20 at. % to 55 at. %, 25 at. % to 35 at. %, and 10 at. % to 30 at. %, respectively. The base layer 201 can be formed by a sputtering method, a CVD method, a coating method, a printing method, or the like as appropriate. In the case where a film containing oxygen such as a silicon nitride oxide film is formed for the base layer 201, a surface of the separation layer 250 is oxidized so that a metal oxide thin film is formed in the surface of the separation layer 250 in the film formation. The metal oxide thin film is handled as the separation layer 250.

In this embodiment, a stack of a silicon nitride layer and a silicon oxide layer is used as the base layer 201. Specifically, a 50-nm-thick silicon nitride layer is formed over the separation layer 250, and a 150-nm-thick silicon oxide layer is formed over the silicon nitride layer. Note that the base layer 201 may be doped with phosphorus (P) or boron (B).

When a halogen element such as chlorine or fluorine is contained in the base layer 201, a function of preventing diffusion of an impurity element from the substrate 200 can be further improved. The concentration of a halogen element contained in the base layer 201 is measured by secondary ion mass spectrometry (SIMS) and its peak is preferably greater than or equal to $1\times10^{15}/cm^3$ and less than or equal to $1\times10^{20}/cm^3$.

The base layer 201 may be formed using gallium oxide. Alternatively, the base layer 201 may have a layered structure of a gallium oxide layer and the above insulating layer. Gallium oxide is a material which is hardly charged; therefore, variation in threshold voltage due to charge buildup of the insulating layer can be suppressed.

Next, over the base layer 201, a first conductive layer is formed to a thickness of greater than or equal to 100 nm and less than or equal to 500 nm, preferably greater than or equal to 200 nm and less than or equal to 300 nm, by a sputtering method, a vacuum evaporation method, or a plating method. Then, a first resist mask is formed over the first conductive layer and the first conductive layer is partly etched using the first resist mask, whereby the gate electrode 202, the capacitor wiring 203, and the wiring 212 are formed.

The first conductive layer for forming the gate electrode 202, the capacitor wiring 203, and the wiring 212 can be formed to have a single-layer structure or a layered structure using a metal material such as molybdenum (Mo), titanium (Ti), tungsten (W), tantalum (Ta), aluminum (Al), copper (Cu), chromium (Cr), neodymium (Nd), or scandium (Sc), or an alloy containing any of these elements as its main component. Alternatively, the first conductive layer may be formed using a conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, abbreviated to ITO), an indium oxide-zinc oxide ($In_2O_3$—ZnO), or any of these metal oxides containing silicon oxide can be used. Still alternatively, a conductive composition containing a conductive macromolecule (also referred to as a conductive polymer) can be used to form the first conductive layer. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the first conductive layer serves as a wiring, a low resistance material such as Al or Cu is preferably used. With use of Al or Cu, signal delay is reduced, so that higher image quality can be expected. Note that Al has low heat resistance, and thus a defect due to hillocks, whiskers, or migration is easily generated. To prevent migration of Al, a layer of a metal having a higher melting point than Al, such as Mo, Ti, or W, is preferably stacked over an Al layer, or an alloy layer of Al and an element which prevents hillocks, such as Nd, Ti, Si, or Cu, is preferably used. In the case where a material containing Al is used for the first conductive layer, the maximum process temperature in a later step is preferably set to 380° C. or lower, more preferably 350° C. or lower.

Also in the case where Cu is used for the first conductive layer, in order to prevent a defect due to migration and diffusion of a Cu element, a layer of a metal having a higher melting point than Cu, such as Mo, Ti, or W, is preferably stacked over the first conductive layer containing Cu. In the case where a material containing Cu is used for the first conductive layer, the maximum process temperature in a later step is preferably set to 450° C. or lower.

In this embodiment, as the first conductive layer, a 5-nm-thick Ti layer is formed over the base layer 201, and a 250-nm-thick Cu layer is formed over the Ti layer. After that, a first resist mask is formed over the first conductive layer and the first conductive layer is partly etched using the first resist mask, so that the gate electrode 202, the capacitor wiring 203, and the wiring 212 are formed (see FIG. 5A).

Note that the first resist mask formed over the first conductive layer may be formed by an inkjet method. Formation of the first resist mask by an inkjet method needs no photomask; thus, manufacturing cost can be reduced. The first resist mask is removed after the etching. Description of a process relating to the removal of the first resist mask is omitted.

Note that the etching of the first conductive layer may be either dry etching or wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be used.

For the dry etching, a parallel plate reactive ion etching (RIE) method or an inductively coupled plasma (ICP) etching method can be used. The etching conditions are preferably set so that the base layer 201 is not etched as much as possible because the base layer 201 has a function of preventing diffusion of an impurity element from the substrate 200.

Then, the first insulating layer 204 serving as a gate insulating layer is formed to a thickness of greater than or equal to 50 nm and less than or equal to 800 nm, preferably greater than or equal to 100 nm and less than or equal to 600 nm over the gate electrode 202, the capacitor wiring 203, and the wiring 212. The first insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate ($Hf_xSi_yO_z$, ($x>0$, $y>0$)), hafnium silicate to which nitrogen is added, hafnium aluminate to which nitrogen is added, or the like. A plasma CVD method, a sputtering method, or the like can be employed. The first insulating layer 204 is not limited to a single layer and may be a stack of different layers. For example, the first insulating layer 204 may be formed in the following manner: a silicon nitride layer ($SiN_y$ ($y>0$)) is formed by a plasma CVD method as a gate insulating layer A and a silicon oxide layer ($SiO_x$ ($x>0$)) is stacked over the gate insulating layer A as a gate insulating layer B.

In addition to a sputtering method and a plasma CVD method, the first insulating layer 204 can be formed by a high-density plasma CVD method using microwaves (e.g., a frequency of 2.45 GHz), for example.

In this embodiment, a stack of silicon nitride and silicon oxide is used as the first insulating layer 204. Specifically, a 50-nm-thick silicon nitride layer is formed over the gate electrode 202, and a 100-nm-thick silicon oxide layer is formed over the silicon nitride layer.

The first insulating layer 204 also functions as a protective layer. With the structure in which the gate electrode 202 containing Cu is covered with the insulating layer containing silicon nitride, diffusion of Cu from the gate electrode 202 can be prevented.

In the case where an oxide semiconductor is used for a semiconductor layer that is formed in a later step, the first insulating layer 204 may be formed using an insulating material containing a component similar to that of the oxide semiconductor. In the case where the first insulating layer 204 is a stack of different layers, a layer in contact with the oxide semiconductor is formed using an insulating material containing a component similar to that of the oxide semiconductor. Such a material is compatible with the oxide semiconductor, and the use of such a material for the first insulating layer 204 allows the interface state between the oxide semiconductor and the first insulating layer 204 to be kept favorable. Here, "a component similar to that of the oxide semiconductor" means one or more elements selected from constituent elements of the oxide semiconductor. For example, in the case where the oxide semiconductor is formed using an In—Ga—Zn-based oxide semiconductor material, gallium oxide is given as an insulating material containing a component similar to that of the oxide semiconductor.

In the case of employing a layered structure, the first insulating layer 204 may have a layered structure of a film formed using an insulating material containing a component similar to that of the oxide semiconductor and a film containing a material different from the component material of the film.

It is preferable that a high-purity gas in which impurities such as hydrogen, water, a compound having a hydroxyl group, and a hydride are removed be used as a sputtering gas when the first insulating layer 204 is formed. For example, the purity of the high-purity gas in which impurities are removed, which is introduced into a sputtering apparatus, is 6N (99.9999%) or higher, preferably 7N (99.99999%) or higher (that is, the impurity concentration is 1 ppm or lower, preferably 0.1 ppm or lower).

Next, the semiconductor layer 205 is formed over the first insulating layer 204.

An oxide semiconductor to be used preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of a lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn—based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Z-based oxide may contain another metal element in addition to In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that one embodiment of the disclosed invention is not limited thereto, and a material having an appropriate composition may be used depending on semiconductor characteristics (mobility, threshold, variation, and the like). Further, it is preferable to appropriately set the carrier concentration, the impurity concentration, the defect density, the atomic ratio of a metal element and oxygen, the interatomic distance, the density, or the like in order to obtain necessary semiconductor characteristics.

For example, with an In—Sn—Zn-based oxide, high mobility can be realized relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same can be applied to other oxides.

The oxide semiconductor may be either a single crystal oxide semiconductor or a non-single-crystal oxide semiconductor. In the latter case, the non-single-crystal oxide semiconductor may be either amorphous or polycrystalline. Further, the oxide semiconductor may have either an amorphous structure including a portion having crystallinity or an amorphous structure having no crystalline region.

In an oxide semiconductor in an amorphous state, a flat surface can be obtained with relative ease, so that interface scattering of a transistor can be suppressed, and relatively high mobility can be obtained with relative ease.

In an oxide semiconductor having crystallinity, defects in the bulk can be further reduced and when surface evenness is improved, mobility higher than that of an oxide semiconductor layer in an amorphous state can be realized. In order to improve the surface evenness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with the following equation.

$$R_a = \frac{1}{S_0} \int_{y1}^{y2} \int_{x1}^{x2} |f(x, y) - Z_0| \, dx \, dy \qquad \text{[EQUATION 1]}$$

Note that in Equation 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of a measurement surface. Ra can be measured using an atomic force microscope (AFM).

As an example of an oxide semiconductor having crystallinity, there is an oxide including a crystal with c-axis alignment (also referred to as a C-Axis Aligned Crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including a CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, part of oxygen may be substituted with nitrogen. The c-axes of individual crystalline portions included in the CAAC may be aligned in one direction (e.g., a direction perpendicular to a surface of a substrate over which the CAAC is formed or to a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or to a surface of a supporting substrate, and in which metal atoms are arranged in a layered manner or metal atoms and oxygen atoms (or nitrogen atoms) are arranged in a layered manner when a cross section of the film is observed.

In this embodiment, as the semiconductor layer 205, an In—Ga—Zn-based oxide semiconductor is formed to a thickness of 30 nm by a sputtering method with the use of an In—Ga—Zn—O-based oxide target (see FIG. 5B).

In order that hydrogen, a hydroxyl group, and moisture may be contained as little as possible in the semiconductor layer 205, it is preferable that the substrate 200 be preheated in a preheating chamber of a sputtering apparatus, for pretreatment before formation of the semiconductor layer 205, so that impurities such as hydrogen or moisture adsorbed onto the substrate 200 and the first insulating layer 204 are eliminated and removed. Note that this preheating treatment may be omitted. Further, this preheating treatment may be similarly performed on the substrate 200 over which components up to and including the gate electrode 202, the capacitor wiring 203, and the wiring 212 are formed, before the formation of the first insulating layer 204.

The filling rate of the metal oxide target is higher than or equal to 90% and lower than or equal to 100%, preferably higher than or equal to 95% and lower than or equal to 99.9%. With the use of the metal oxide target with a high filling rate, the formed oxide semiconductor layer can have high density.

It is preferable that a high-purity gas in which impurities such as hydrogen, water, a compound having a hydroxyl group, and a hydride are removed be used as a sputtering gas when the semiconductor layer 205 is formed. For example, the purity of the high-purity gas in which impurities are removed, which is introduced into a sputtering apparatus, is 6N (99.9999%) or higher, preferably 7N (99.99999%) or higher (that is, the impurity concentration is 1 ppm or lower, preferably 0.1 ppm or lower).

The semiconductor layer 205 is preferably formed by a sputtering method in which impurities such as hydrogen, water, a hydroxyl group, and a hydride are less likely to enter the semiconductor layer. Deposition is performed in an oxygen gas atmosphere while the substrate heating temperature is higher than or equal to 100° C. and lower than or equal to 600° C., preferably higher than or equal to 150° C. and lower than or equal to 550° C., more preferably higher than or equal to 200° C. and lower than or equal to 500° C. Note that when Al is used for a wiring layer (e.g., the gate electrode 202) formed by etching the first conductive layer, the substrate temperature is set to lower than or equal to 380° C., preferably lower than or equal to 350° C. Note that when Cu is used for a wiring layer formed by etching the first conductive layer, the substrate temperature is set to lower than or equal to 450° C. The thickness of the semiconductor layer 205 is greater than or equal to 1 nm and less than or equal to 40 nm, preferably greater than or equal to 3 nm and less than or equal to 20 nm. As the substrate heating temperature in deposition is higher, the impurity concentration of the obtained semiconductor layer 205 is lower. Further, the atomic arrangement in the semiconductor layer 205 is ordered, the density thereof is increased, so that a polycrystal or a CAAC is readily formed. Furthermore, since an oxygen gas atmosphere is employed for the deposition, an unnecessary atom is not contained in the semiconductor layer 205 unlike in the case of employing a rare gas atmosphere or the like, so that a polycrystal or a CAAC is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. Note that as the semiconductor layer 205 is thinner, a short-channel effect of a transistor is reduced. However, when the semiconductor layer 205 is too thin, the semiconductor layer 205 is significantly influenced by interface scattering; thus, the field effect mobility might be decreased.

By heating the substrate during the deposition, the concentration of impurities such as hydrogen, moisture, a hydride, or a hydroxyl group in the semiconductor layer 205 can be reduced. In addition, damage due to sputtering can be reduced. Then, a high-purity gas in which impurities such as hydrogen, water, a compound having a hydroxyl group, and a hydride are removed is introduced into the deposition chamber from which moisture remaining therein is being removed, and the semiconductor layer 205 is formed with use of the above target.

In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, a hydrogen atom, a compound containing a hydrogen atom such as water ($H_2O$), (more preferably, also a compound containing a carbon atom), and the like are evacuated, whereby the impurity concentration in the semiconductor layer 205 formed in the deposition chamber can be reduced.

An example of the deposition conditions is as follows: the distance between the substrate and the target is 100 mm, the pressure is 0.6 Pa, the DC power is 0.5 kW, and an oxygen atmosphere (the flow rate of oxygen is 100%) is used. Note that a pulsed DC power source is preferably used, in which case powder substances (also referred to as particles or dust) that are generated in deposition can be reduced and the film thickness can be uniform.

Note that it has been pointed out that an oxide semiconductor is insensitive to impurities and there is no problem when a considerable amount of metal impurities is contained in an oxide semiconductor film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, such consideration is not appropriate. When the concentration of alkali metals in the oxide semiconductor is measured by secondary ion mass spectroscopy, it is preferred that the sodium (Na) content is $5 \times 10^{16}$ cm$^{-3}$ or less, preferably $1 \times 10^{16}$ cm$^{-3}$ or less, more preferably $1 \times 10^{15}$ cm$^{-3}$ or less; the lithium (Li) content is $5 \times 10^{15}$ cm$^{-3}$ or less, preferably $1 \times 10^{15}$ cm$^{-3}$ or less; and the potassium (K) content is $5 \times 10^{15}$ cm$^{-3}$ or less, preferably $1 \times 10^{15}$ cm$^{-3}$ or less.

An alkali metal and an alkaline earth metal are adverse impurities for the oxide semiconductor and are preferably contained as little as possible. Alkali metal, in particular, a Na ion diffuses from an insulating film to an oxide when the insulating film in contact with the oxide semiconductor is an oxide. In addition, Na cleaves a bond between metal and oxygen or is inserted between the metal-oxygen bond. As a result, deterioration of transistor characteristics (e.g., the shift of a threshold value to the negative side (causing the transistor to be normally on) or a decrease in mobility) is caused. In addition, this also causes variation in the characteristics. Such a problem is significant especially in the case where the hydrogen concentration in the oxide semiconductor is extremely low. Therefore, the concentration of an alkali metal is strongly required to be set to the aforementioned value in the case where the hydrogen concentration in the oxide semiconductor is lower than or equal to $5 \times 10^{19}$ cm$^{-3}$, particularly in the case where it is lower than or equal to $5 \times 10^{18}$ cm$^{-3}$.

Even when the semiconductor layer 205 is formed by the method described above, the semiconductor layer 205 contains moisture or hydrogen (including a hydroxyl group) as an impurity in some cases. Moisture or hydrogen easily forms donor levels and thus serves as an impurity in the oxide semiconductor. In order to reduce impurities such as moisture and hydrogen in the semiconductor layer 205 (dehydrate or dehydrogenate the semiconductor layer 205), the semiconductor layer 205 may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

By performing the first heat treatment on the semiconductor layer 205, moisture or hydrogen at the surface of the semiconductor layer 205 and in the semiconductor layer 205 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; therefore, treatment can be performed even at a temperature higher than the strain point of a glass substrate. Note that when Al is used for a wiring layer (e.g., the gate electrode 202) formed by etching the first conductive layer, the heat treatment temperature is set to lower than or equal to 380° C., preferably lower than or equal to 350° C. Note that when Cu is used for a wiring layer formed by etching the first conductive layer, the heat treatment temperature is set to lower than or equal to 450° C.

Note that a heat treatment apparatus is not limited to an electric furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, a rare gas like argon or an inert gas which does not react with an object to be processed by heat treatment, such as nitrogen, is used.

The first heat treatment is performed in a reduced-pressure atmosphere or an inert gas atmosphere such as a nitrogen atmosphere, a helium atmosphere, a neon atmosphere, or an argon atmosphere. Note that it is preferable that the above atmosphere do not contain moisture, hydrogen, and the like. The purity of nitrogen, or a rare gas such as helium, neon, or argon which is introduced into a heat treatment apparatus is set to 6N (99.9999%) or higher, preferably 7N (99.99999%) or higher (that is, the impurity concentration is 1 ppm or lower, preferably 0.1 ppm or lower).

The semiconductor layer 205 which has been subjected to the first heat treatment may be further subjected to second heat treatment. The second heat treatment is performed in an oxidizing atmosphere in order to supply oxygen into the semiconductor layer 205, whereby oxygen vacancies generated in the semiconductor layer 205 in the first heat treatment can be compensated. Thus, the second heat treatment can be referred to as treatment for supplying oxygen. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the semiconductor layer can be increased. Note that heat treatment for longer than 24 hours is not preferable because the productivity is reduced.

The oxidizing atmosphere is an atmosphere containing an oxidizing gas. Note that the oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

The semiconductor layer 205 purified by a sufficient reduction in hydrogen concentration, in which defect levels in the energy gap due to oxygen deficiency are reduced as a result of sufficient supply of oxygen, has a carrier concentration of less than $1\times10^{12}/cm^3$, less than $1\times10^{11}/cm^3$, or less than $1.45\times10^{10}/cm^3$. Accordingly, the off-state current (per unit channel width (1 μm) here) at room temperature (25° C.) is 100 zA/μm (1 zA (zeptoampere) is $1\times10^{-21}$ A) or lower or 10 zA/μm or lower. The off-state current at 85° C. is 100 zA/μm ($1\times10^{-19}$ A/μm) or lower or 10 zA/μm ($1\times10^{-20}$ A/μm) or lower. The transistor 111 with extremely excellent off-state current characteristics can be obtained with use of such an oxide semiconductor in which the carrier concentration is significantly reduced (also referred to as an i-type (intrinsic) or substantially i-type oxide semiconductor).

The electric characteristics of the transistor 111, such as the threshold voltage and the on-state current, have almost no temperature dependence. Further, the change in transistor characteristics due to light deterioration hardly occurs.

Thus, variation in electric characteristics of a transistor including a highly purified oxide semiconductor in which the carrier concentration is significantly reduced is suppressed and thus, the transistor is electrically stable. Accordingly, with the use of an oxide semiconductor having stable electric characteristics, a highly reliable liquid crystal display device can be provided.

Note that although the case where the first heat treatment and the second heat treatment are performed on the semiconductor layer 205 immediately after the formation of the semiconductor layer 205 is described above, the heat treatment may be performed at any timing as long as it is after the formation of the semiconductor layer 205.

Further, after the formation of the semiconductor layer 205, oxygen adding treatment described below may be first performed on the semiconductor layer 205, and then the first heat treatment may be performed to eliminate hydrogen, a hydroxyl group, or moisture contained in the oxide semiconductor and simultaneously to allow the oxide semiconductor to be crystallized. The crystallization may be performed in an additional heat treatment performed later. Through such crystallization or recrystallization process, the crystallinity of the semiconductor layer 205 can be further improved.

Here, the "oxygen adding treatment" means that oxygen (which includes at least one of an oxygen radical, an oxygen atom, and an oxygen ion) is added to a bulk of the semiconductor layer 205. Note that the term "bulk" is used in order to clarify that oxygen is added not only to a surface of a thin film but also to the inside of the thin film. Further, "oxygen doping" includes "oxygen plasma doping" in which oxygen which is made to be plasma is added to a bulk. When oxygen adding treatment is performed, the amount of oxygen contained in the semiconductor layer 205 can be made larger than that in the stoichiometric ratio. Further, after the formation of the second insulating layer 207 in a subsequent step, the second insulating layer 207 may be subjected to oxygen adding treatment, whereby the amount of oxygen in the second insulating layer 207 can be made larger than that in the stoichiometric ratio. By performing the oxygen adding treatment and then heat treatment on the second insulating layer 207, oxygen in the second insulating layer 207 can be transported to the semiconductor layer 205 to compensate oxygen vacancies in the semiconductor layer 205 efficiently.

The oxygen adding treatment is preferably performed by an inductively coupled plasma (ICP) method, using oxygen plasma excited by microwaves (with a frequency of 2.45 GHz, for example).

Note that the oxygen adding treatment can also be referred to as treatment for supplying oxygen because it is performed so that the amount of oxygen in the semiconductor layer 205, the second insulating layer 207, or the like is larger than that in the stoichiometric ratio. The excess oxygen exists mainly between lattices. When the concentration of oxygen is set to higher than or equal to $1\times10^{16}/cm^3$ and lower than or equal to $2\times10^{20}/cm^3$, excess oxygen can be contained in the oxide semiconductor without causing crystal distortion or the like.

Next, a second conductive layer is formed over the semiconductor layer 205, a second resist mask is formed over the second conductive layer, and the second conductive layer is partly etched using the second resist mask, so that the source electrode 206a, the drain electrode 206b, and the wiring 216 are formed.

The second conductive layer for forming the source electrode 206a, the drain electrode 206b, and the wiring 216 can be formed to have a single-layer structure or a layered structure using a metal such as molybdenum (Mo), titanium (Ti), tungsten (W), tantalum (Ta), aluminum (Al), copper (Cu), chromium (Cr), neodymium (Nd), or scandium (Sc), or an alloy containing any of these as its main component. Alternatively, the second conductive layer may be formed using a conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, abbreviated to ITO), an indium oxide-zinc oxide ($In_2O_3$—ZnO), or any of these metal oxide materials containing silicon oxide can be used. Still alternatively, a conductive composition containing a conductive macromolecule (also referred to as a conductive polymer) can be used to form the second conductive layer. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the second conductive layer serves as a wiring, a low resistance material such as Al or Cu is preferably used. With use of Al or Cu, signal delay is reduced, so that higher image quality can be expected. Note that Al has low heat resistance, and thus a defect due to hillocks, whiskers, or migration is easily generated. To prevent migration of Al, a layer of a metal material having a higher melting point than Al, such as Mo, Ti, or W, is preferably stacked over an Al layer, or an alloy layer of Al and an element which prevents hillocks, such as Nd, Ti, Si, or Cu, is preferably used. In the case where a material containing Al is used for the second conductive layer, the maximum process temperature in a later step is preferably set to 380° C. or lower, more preferably 350° C. or lower.

Also in the case where Cu is used for the second conductive layer, in order to prevent a defect due to migration and diffusion of a Cu element, a layer of a metal material having a higher melting point than Cu, such as Mo, Ti, or W, is preferably stacked over the second conductive layer containing Cu. In the case where a material containing Cu is used for the second conductive layer, the maximum process temperature in a later step is preferably set to 450° C. or lower.

In this embodiment, as the second conductive layer, a 5-nm-thick Ti layer is formed over the semiconductor layer 205, and a 250-nm-thick Cu layer is formed over the Ti layer. After that, a second resist mask is formed over the second conductive layer and the second conductive layer is partly etched using the second resist mask, so that the source electrode 206a, the drain electrode 206b, and the wiring 216 are formed (see FIG. 5C).

Note that the second resist mask formed over the second conductive layer may be formed by an inkjet method. Formation of the second resist mask by an inkjet method needs no photomask; thus, manufacturing cost can be reduced. The second resist mask is removed after the etching. Description thereof is omitted.

Then, over the source electrode 206a, the drain electrode 206b, the wiring 216, and the semiconductor layer 205, the second insulating layer 207 is formed (see FIG. 6A). The second insulating layer 207 can be formed using a material and a method similar to those of the first insulating layer 204 or the base layer 201. A sputtering method is preferably employed for forming the second insulating layer 207 in terms of low possibility of entry of hydrogen and an impurity congaing hydrogen. If hydrogen is contained in the second insulating layer 207, hydrogen might enter the semiconductor layer or extract oxygen in the semiconductor layer. Therefore, it is important to form the second insulating layer 207 by a method in which hydrogen and impurities containing hydrogen are not contained therein.

For the second insulating layer 207, an inorganic insulating material such as silicon oxide, silicon oxynitride, hafnium oxide, aluminum oxide, or gallium oxide can be used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the second insulating layer 207 or stacked over the second insulating layer 207.

In this embodiment, as the second insulating layer 207, a 200-nm-thick silicon oxide layer is formed by a sputtering method. The substrate temperature in deposition may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, a silicon oxide or silicon can be used. For example, with use of silicon for the target, a silicon oxide layer can be formed by sputtering in an atmosphere containing oxygen.

In order to remove moisture remaining in the deposition chamber at the time of formation of the second insulating layer 207, an entrapment vacuum pump such as a cryopump, an ion pump, or a titanium sublimation pump is preferably used. For example, the second insulating layer 207 is formed in the deposition chamber evacuated using a cryopump, whereby the impurity concentration in the second insulating layer 207 can be reduced. Alternatively, as an evacuation unit for removing moisture remaining in the deposition chamber, a turbo molecular pump provided with a cold trap may be used.

It is preferable that a high-purity gas in which impurities such as hydrogen, water, a compound containing a hydroxyl group, and a hydride are removed be used as a sputtering gas when the second insulating layer 207 is formed. For example, the purity of the high-purity gas in which impurities such as hydrogen, water, a compound containing a hydroxyl group, and a hydride are removed is 6N (99.9999%) or higher, preferably 7N (99.99999%) or higher (that is, the impurity concentration is 1 ppm or lower, preferably 0.1 ppm or lower).

Then, third heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., more preferably higher than or equal to 250° C. and lower than or equal to 550° C.). Note that in the case where Al is used for one of or both the wiring layer formed by etching the first conductive layer and the wiring layer formed by etching the second conductive layer, the heat treatment temperature is set to 380° C. or lower, preferably 350° C. or lower. Alternatively, in the case where Cu is used for the wiring layer, the heat treatment temperature is set to 450° C. or lower. For example, the third heat treatment may be performed in a nitrogen atmosphere at 450° C. for one hour. In the third heat treatment, part of the semiconductor layer (channel formation region) is heated in the state where it is in contact with the second insulating layer 207, and thus oxygen can be supplied from the second insulating layer 207 containing oxygen to the semiconductor layer 205 so that oxygen vacancies in the semiconductor layer 205 can be reduced. Note that in the atmosphere at the time of the third heat treatment, impurities such as water and hydrogen are preferably reduced as much as possible as in the deposition chamber where the second insulating layer 207 is formed.

Next, a third resist mask is formed over the second insulating layer 207, and the second insulating layer 207, the semiconductor layer 205, and the first insulating layer 204 are partly etched. At that time, in part of a pixel, where a thin film transistor is not formed, part of the second insulating layer 207, part of the semiconductor layer 205, and part of the first insulating layer 204 are removed, resulting in formation of a pixel opening 225. Further, over the drain electrode 206b, only the second insulating layer 207 is etched and thus a contact hole 208 is formed. Over the wiring 216 in the cross section E1-E2, only the second insulating layer 207 is etched and thus the contact hole 220 is formed. Over the wiring 212 in the cross section D1-D2, the second insulating layer 207, the semiconductor layer 205, and the first insulating layer 204 are etched, and thus a contact hole 219 is formed (see FIG. 6B).

Note that the second insulating layer 207, the semiconductor layer 205, and the first insulating layer 204 in the pixel opening (part of a pixel, where a thin film transistor is not formed) are not necessarily etched. However, in the case where a liquid crystal display device is used as a transmissive liquid crystal display device, etching of the second insulating layer 207, the semiconductor layer 205, and the first insulating layer 204 in the pixel opening improves the transmittance of a pixel. Accordingly, the pixel transmits light from a backlight efficiently, and thus reduction in power consumption or improvement in display quality due to increase in luminance is possible.

For the etching of the second insulating layer 207, the semiconductor layer 205, and the first insulating layer 204, either dry etching or wet etching or both may be employed. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

For the dry etching, a parallel plate reactive ion etching (RIE) method or an inductively coupled plasma (ICP) etching method can be used. The etching conditions are preferably set so that the base layer 201 is not etched as much as possible because the base layer 201 has a function of preventing diffusion of an impurity element from the substrate 200.

In general, etching of a semiconductor layer and formation of a contact hole in an insulating layer are performed separately by different resist mask formation steps and different etching steps; however, according to the manufacturing process of this embodiment, the etching of a semiconductor layer and the formation of a contact hole in an insulating layer can be performed by one resist mask formation step and one etching step. Therefore, not only reduction in the number of photomasks but also reduction in the number of resist mask formation steps and the number of different etching steps can be achieved. Owing to reduction in the number of steps, a liquid crystal display device can be manufactured at low cost with high productivity.

In addition, according to the manufacturing process of this embodiment, a resist mask is not directly formed on the semiconductor layer 205. Further, since the channel formation region in the semiconductor layer 205 is protected by the second insulating layer 207, moisture is not attached to the channel formation region in the semiconductor layer in a separation step of a photoresist, a cleaning step, and the like; thus, variation in characteristics of the transistor 111 is reduced and the reliability is increased. Particularly in the case where an oxide semiconductor is used as the semiconductor layer 205, the above effect is more noticeable.

Next, a third conductive layer is formed over the second insulating layer 207 by a sputtering method, a vacuum evaporation method, or the like, a fourth resist mask is formed over the third conductive layer, and the third conductive layer is partly etched, so that the pixel electrode 210, the electrode 221, and the electrode 222 are formed. Note that the third conductive layer is preferably formed to a thickness of greater than or equal to 30 nm and less than or equal to 200 nm, preferably greater than or equal to 50 nm and less than or equal to 100 nm. Through the above steps, the element region 260 is formed over the substrate 200 with the separation layer 250 interposed therebetween (see FIG. 6C).

For the third conductive layer which is used as the pixel electrodes, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added is preferably used. Alternatively, a material formed of 1 to 10 graphene sheets (corresponding to one layer of graphite) may be used. Still alternatively, a conductive composition containing a conductive macromolecule (also referred to as a conductive polymer) can be used to form the third conductive layer. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

In this embodiment, as the third conductive layer, a 80-nm-thick ITO layer is formed, and a fourth resist mask is formed and the third conductive layer is partly etched, whereby the pixel electrode 210, the electrode 221, and the electrode 222 are formed.

The pixel electrode 210 is electrically connected to the drain electrode 206b through the contact hole 208. The electrode 221 is electrically connected to the wiring 212 through the contact hole 219. The electrode 222 is electrically connected to the wiring 216 through the contact hole 220.

In the contact hole 219 and the contact hole 220, it is important that the wiring 212 and the wiring 216 be not kept exposed and be covered with an oxide conductive material such as ITO. Since the wiring 212 and the wiring 216 are metal layers, if the wiring 212 and the wiring 216 are kept exposed, the exposed surfaces are oxidized and contact resistance with a FPC or the like is increased, leading to reduction in reliability. The exposed surfaces of the wiring 212 and the wiring 216 are covered with an oxide conductive material such as ITO, whereby increase in contact resistance can be prevented and thus the reliability of the liquid crystal display device can be improved.

Although not illustrated in the drawing, the transistor provided over the element region 260 is prone to fracture due to static electricity or the like; thus, a protective circuit is preferably provided. The protective circuit is preferably formed using a nonlinear element.

According to this embodiment, a liquid crystal display device can be manufactured through fewer photolithography processes as compared with the conventional case. Consequently, a liquid crystal display device can be manufactured at low cost with high productivity. Further, the element region 260 needed for operating the liquid crystal display device is provided over the substrate 200 with the separation layer 250 interposed therebetween; thus, the element region 260 can be separated from the substrate 200 and transferred to another support.

This embodiment can be freely combined with any of the other embodiments.

(Embodiment 2)

Figure 7A:
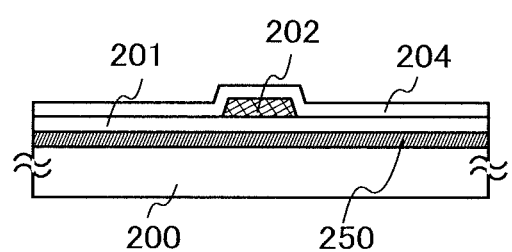
FIGS. 7A to 7C are cross-sectional views illustrating one embodiment of the present invention.
Figure 7B:
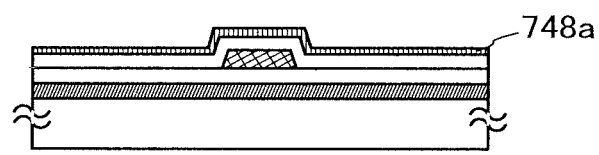
Figure 7C:
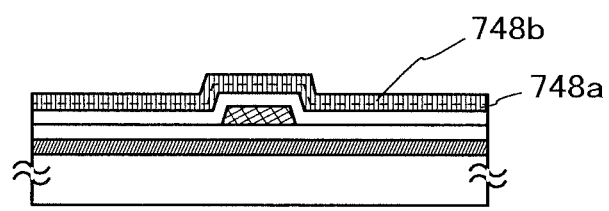

In this embodiment, a process example partly different from that described in Embodiment 1 is described with reference to FIGS. 7A to 7C. Note that the same reference numerals are used for the same parts as those in Embodiment 1, and specific description of the parts with the same reference numerals is omitted here. Further in this embodiment, the example of the steps of only a transistor portion will be described with reference to drawings.

First, as in Embodiment 1, the separation layer 250 is formed over the substrate 200 having an insulating surface, a first conductive layer is formed over the separation layer 250, a first resist mask is formed over the first conductive layer, and then, the first conductive layer is selectively etched using the first resist mask to form the gate electrode 202.

An insulating layer serving as a base layer may be formed between the separation layer 250 and the gate electrode 202. In this embodiment, the base layer 201 is formed. The base layer 201 has a function of preventing diffusion of an impurity element (e.g., Na) from the substrate 200, and can be formed using a film selected from a silicon oxide film, a silicon oxynitride film, a silicon nitride film, a hafnium oxide film, an aluminum oxide film, a gallium oxide film, and a gallium aluminum oxide film. The structure of the base layer 201 is not limited to a single-layer structure, and may be a layered structure of a plurality of the above films.

In this embodiment, the deposition temperature of a semiconductor layer formed later is higher than or equal to 200° C. and lower than or equal to 450° C., and the temperature of heat treatment performed after the formation of the semiconductor layer is higher than or equal to 200° C. and lower than or equal to 450° C. Therefore, for the gate electrode 202, a layered structure in which copper is a lower layer and molybdenum is an upper layer, or a layered structure in which copper is a lower layer and tungsten is an upper layer is employed.

Next, as in Embodiment 1, the first insulating layer 204 is formed over the gate electrode 202 by a CVD method, a sputtering method, or the like. FIG. 7A is a cross-sectional view illustrating the structure obtained through the steps up to and including this step.

Then, over the first insulating layer 204, a first semiconductor layer is formed to a thickness of greater than or equal to 1 nm and less than or equal to 10 nm. In this embodiment, the first semiconductor layer is formed to a thickness of 5 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$: ZnO=1:1:2 [molar ratio]) is used; the distance between the substrate and the target is 170 mm; the substrate temperature is 250° C.; the pressure is 0.4 Pa; and the direct current (DC) power is 0.5 kW.

After that, the first heat treatment is performed with the substrate placed in a nitrogen atmosphere or a dry air atmosphere. The temperature of the first heat treatment is set to higher than or equal to 200° C. and lower than or equal to 450° C. In the first heat treatment, heating is performed for greater than or equal to one hour and less than or equal to 24 hours. Through the first heat treatment, a first crystalline semiconductor layer 748a is formed (see FIG. 7B).

Next, a second semiconductor layer is formed to a thickness of greater than 10 nm over the first crystalline semiconductor layer 748a. In this embodiment, the second semiconductor layer is formed to a thickness of 25 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$:ZnO=1:1:2 [molar ratio]) is used; the distance between the substrate and the target is 170 mm; the substrate temperature is 400° C.; the pressure is 0.4 Pa; and the direct current (DC) power is 0.5 kW.

Then, the second heat treatment is performed with the substrate placed in a nitrogen atmosphere or a dry air atmosphere. The temperature of the second heat treatment is set to higher than or equal to 200° C. and lower than or equal to 450° C. In the second heat treatment, heating is performed for greater than or equal to one hour and less than or equal to 24 hours. Through the second heat treatment, a second crystalline semiconductor layer 748b is formed (see FIG. 7C).

Subsequent steps are performed according to Embodiment 1. After the source electrode 206a, the drain electrode 206b, and the second insulating layer 207 are formed, a step of simultaneously forming a first opening and a second opening is performed using a single resist mask. The first opening is formed by etching part of the second insulating layer 207, which overlaps with the drain electrode 206b. The second opening is formed by etching part of the second insulating layer 207, part of the first crystalline semiconductor layer 748a, part of the second crystalline semiconductor layer 748b, part of the first insulating layer 204, and part of the second insulating layer 207, which do not overlap with the source electrode 206a and the drain electrode 206b. Accordingly, the number of steps can be reduced.

After that, the transistor 111 can be obtained by the steps similar to those in Embodiment 1. Note that in the case where this embodiment is employed, the semiconductor layer including a channel formation region of such a transistor has a layered structure of the first crystalline semiconductor layer 748a and the second crystalline semiconductor layer 748b. After the formation of the first crystalline semiconductor layer 748a, the first heat treatment is performed so that the first crystalline semiconductor layer 748a includes a CAAC. Then, the second crystalline semiconductor layer 748b is formed and subjected to the second heat treatment, whereby with the first crystalline semiconductor layer 748a as a seed, a crystal (CAAC) grows in the second crystalline semiconductor layer 748b. Thus, an oxide semiconductor including a CAAC can be formed efficiently.

The transistor having a layered structure of the first crystalline semiconductor layer and the second crystalline semiconductor layer has stable electric characteristics. When the transistor is irradiated with light or subjected to a bias-temperature (BT) test, the amount of change of threshold voltage of the transistor can be reduced.

This embodiment can be freely combined with any of the other embodiments.

(Embodiment 3)

In this embodiment, an example of a structure of a semiconductor device which is thin, lightweight, and significantly tough and which is manufactured in such a manner that the element region 260 formed in Embodiments 1 and 2 is separated from the substrate 200 and is provided over a different support will be described with reference to FIGS. 8A and 8B. In addition, an example of a method for manufacturing the semiconductor device will be described with reference to FIGS. 9A to 9C, FIGS. 10A to 10C, and FIGS. 11A and 11B.

Figure 8A:
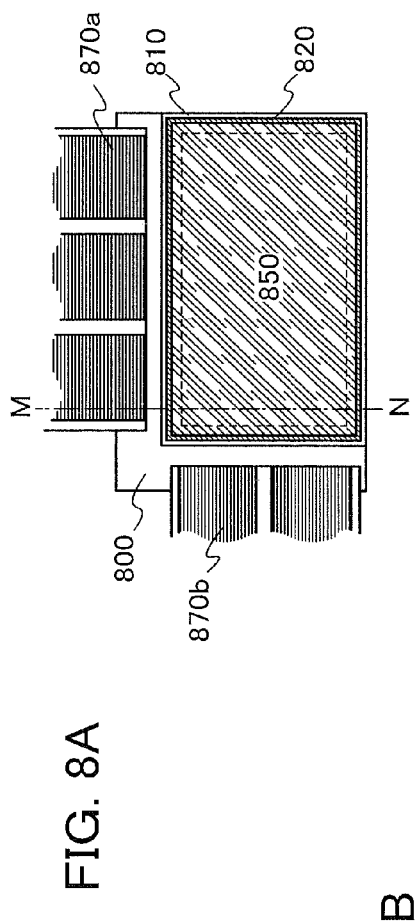
FIGS. 8A and 8B are a top view and a cross-sectional view illustrating one embodiment of the present invention.
Figure 8B:
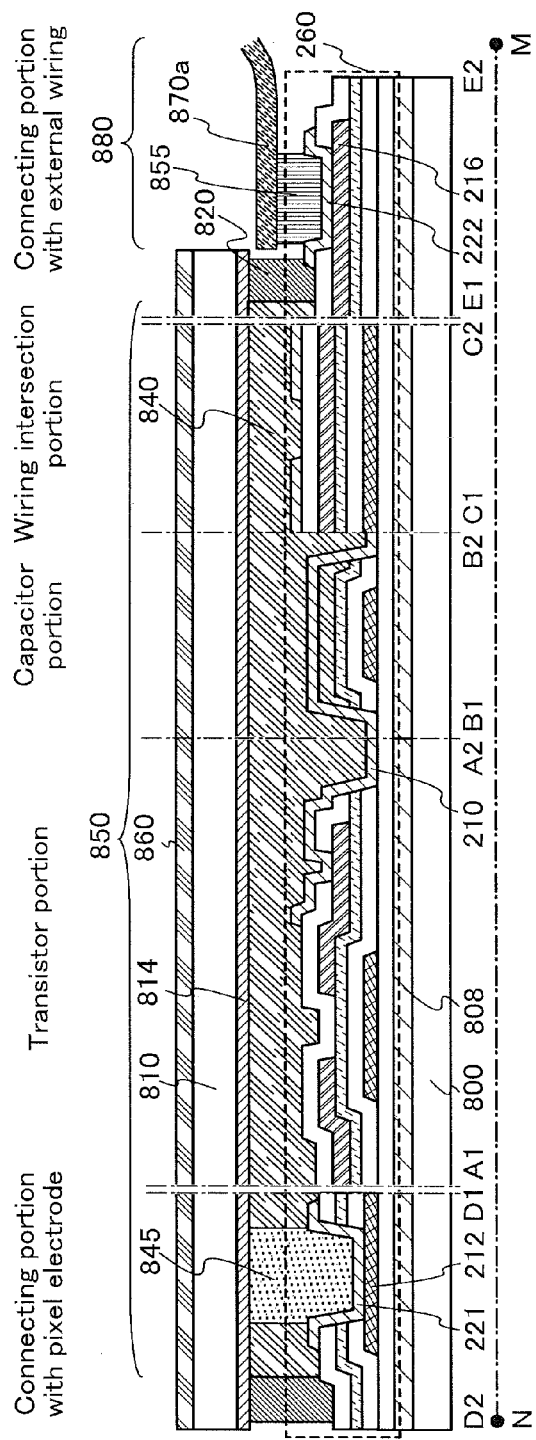

To make description on a cross-sectional view of a liquid crystal display device in FIG. 8B, the cross-sectional view of the element region 260 described in Embodiment 1 is used for a cross-sectional view of a pixel portion 850. Note that description will be made assuming that the driving method of the liquid crystal display device in this embodiment is that of a vertical alignment (VA) mode, and the liquid crystal display device is a reflective monochrome liquid crystal display device including a liquid crystal material exhibiting a blue phase as a liquid crystal layer.

The VA mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be given. Moreover, it is possible to use a method called domain multiplication or multi-domain design, in which a pixel is divided into some regions (subpixels) and molecules are aligned in different directions in their respective regions. The VA mode is a method of controlling alignment of liquid crystal molecules of a liquid crystal display panel, in which liquid crystal molecules are aligned vertically to a panel surface when no voltage is applied.

Note that for the liquid crystal display device in this embodiment, a VA mode is used; however, the embodiment of the present invention is not limited thereto. For example, a driving method such as a TN (twisted nematic) mode, an IPS (in-plane-switching) mode, an FFS (fringe field switching) mode, an ASM (axially symmetric aligned micro-cell) mode, an OCB (optically compensated birefringence) mode, an FLC (ferroelectric liquid crystal) mode, or an AFLC (antiferroelectric liquid crystal) mode may alternatively be used.

<Example of Structure of Liquid Crystal Display Device>

FIG. 8A is a plan view of a panel in which the element region 260 and a liquid crystal material 840 are sealed between a first support 800 and a second support 810 with a sealant 820. FIG. 8B is a cross-sectional view along dashed-dotted line M-N in FIG. 8A.

The first support 800 has a fracture toughness of the greater than or equal to 1.5 [$MPa \cdot m^{1/2}$], and is provided with the element region 260 with an adhesive 808 for fixation interposed between the first support 800 and the element region 260. The use of a material whose fracture toughness is greater than or equal to 1.5 [$MPa \cdot m^{1/2}$] for the first support 800 makes it possible to manufacture a liquid crystal display device which is thin, lightweight, and significantly tough.

The fracture toughness of the second support 810 is greater than or equal to 1.5 [MPa·m$^{1/2}$]. A fourth conductive layer 814 is provided on one surface of the second support 810, and a polarization filter 860 is provided over the other surface of the second support 810. The use of a material whose fracture toughness is greater than or equal to 1.5 [MPa·m$^{1/2}$] for the second support 810 makes it possible to manufacture a liquid crystal display device which is thin, lightweight, and significantly tough.

The sealant 820, the liquid crystal material 840, and a first conductive material 845 are sandwiched between the first support 800 provided with the element region 260 and the second support 810 provided with the fourth conductive layer 814. Note that the sealant 820 is provided so as to surround the pixel portion 850; thus, the liquid crystal material 840 does not leak outside the sealant 820. The first conductive material 845 is provided to electrically connect the wiring 212 formed in the element region 260 and the fourth conductive layer 814 formed on the second support. Thus, alignment of the liquid crystal material 840 can be changed by application of voltage between the fourth conductive layer 814 and the pixel electrode 210.

An input terminal 880 is provided outside the region surrounded by the sealant 820 provided over the first support 800, and external wirings 870*a* and 870*b* are connected to the wiring 216 in the element region 260 through a second conductive material 855. The external wirings 870*a* and 870*b* each have a function of externally supplying power and signals necessary for operating the liquid crystal display device through the second conductive material 855.

With the above structure, a liquid crystal display device which is thin, lightweight, and less prone to fracture can be manufactured.

<Method for Manufacturing Liquid Crystal Display Device>

Next, an example of a method for manufacturing the liquid crystal display device described above will be described with reference to FIGS. 9A to 9C, FIGS. 10A to 10C, and FIGS. 11A and 11B. Note that a manufacturing process of the liquid crystal display device in this embodiment will be described by dividing it into a "step of providing an element region over a first support", a "step of forming a second support", and a "step of sealing a liquid crystal layer".

<Step of Providing Element Region Over First Support>

First, a temporary supporting base 902 is bonded to a surface of the element region 260 in Embodiment 1, which is formed over the substrate 200 with the separation layer 250 interposed therebetween, with the use of an adhesive 900 for separation, and then the element region 260 is separated from the substrate 200 and transferred to the temporary supporting base 902 (see FIG. 9A). Note that in this specification, this step of separating the element region 260 along the separation layer 250 and transferring the element region 260 to the temporary supporting base 902 is referred to as a transfer step.

As the adhesive 900 for separation, an adhesive which can be removed from the temporary supporting base 902 and the element region 260 as necessary, such as an adhesive which is soluble to water or an organic solvent or an adhesive which can be plasticized by ultraviolet light irradiation. The adhesive 900 for separation is preferably formed to be thin and have a uniform thickness using any of coating machines such as a spin coater, a slit coater, a gravure coater, and a roll coater, or any of printing machines such as a flexible printing machine, an offset printing machine, a gravure printing machine, a screen printing machine, and an inkjet machine.

As the temporary supporting base 902, a tape whose adhesion of a surface can be arbitrarily decreased, such as a UV separation tape and a thermal separation tape, can be used. Alternatively, a glass substrate, a quartz substrate, a sapphire substrate, a ceramic substrate, a metal substrate, a plastic substrate, or the like may be used. Note that in the case where the tape whose adhesion of a surface can be arbitrarily decreased is used, the adhesive 900 for separation is not necessarily required separately. In the case where a plastic substrate is used as the temporary supporting base 902, a plastic substrate having heat resistance high enough to withstand the temperature of a process performed later is preferably used.

Note that there is no particular limitation on the method for bonding the temporary supporting base 902 to the element region 260. When a flexible material such as the tape is used as the temporary supporting base 902, a device which can perform bonding using a roller (also referred to as a roll laminator) may be used, for example. Accordingly, the element region 260 and the temporary supporting base 902 can be reliably bonded to each other without air bubbles and the like therebetween.

In this embodiment, an adhesive which is cured by ultraviolet light irradiation and is soluble to water (hereinafter referred to as a water-soluble adhesive) is used as the adhesive 900 for separation, and is lightly applied to a surface of the element region 260 with a spin coating apparatus, and curing treatment is performed. After that, a UV separation tape (a tape whose adhesion can be weakened by UV irradiation) as a temporary supporting base is adhered to the adhesive 900 for separation with the use of a roll laminator.

Any of various methods can be used as appropriate to separate the element region 260 from the substrate 200. For example, in the case where the separation layer 250 is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy or compound which contains any of the above elements as a main component, and where a metal oxide film is formed in the surface of the separation layer 250 (for example, in the case where a film containing oxygen is formed as the base layer 201 after formation of the separation layer 250 as described in Embodiment 1), the metal oxide film is crystallized to be embrittled and force (force to separate the temporary supporting base 902 from the substrate 200) is applied, so that the element region 260 can be separated along the separation layer 250.

Further, when an amorphous silicon film containing hydrogen is formed as the separation layer 250, the amorphous silicon film containing hydrogen is removed by laser light irradiation or etching, so that the element region 260 can be separated from the substrate 200. When a film containing nitrogen, oxygen, hydrogen, or the like (for example, an amorphous silicon film containing hydrogen, an alloy film containing hydrogen, an alloy film containing oxygen, or the like) is used as the separation layer 250, the separation layer 250 is irradiated with laser light to release nitrogen, oxygen, or hydrogen contained in the separation layer 250 as a gas, so that separation of the element region 260 from the substrate 200 can be promoted. Further, a method in which the separation layer 250 is removed by etching with the use of a halogen fluoride gas such as $NF_3$, $BrF_3$, or $ClF_3$ may be used.

In the case where an organic resin is used for the separation layer 250, stress inherent in the organic resin may be utilized for separation.

Further, the separation process can be facilitated by using plural kinds of separation methods described above in combination. Specifically, the separation can be performed with physical force (by a machine or the like) after performing laser light irradiation on part of the separation layer, etching on part of the separation layer with a gas, a solution, or the like, or removal of part of the separation layer with mechanical force of a sharp knife, a scalpel, or the like, in order that the separation layer and the element region can be easily separated from each other. In the case where the separation layer 250 is formed to have a layered structure of metal and a metal oxide, the layer to be separated can be physically separated easily from the separation layer by using, for example, a groove formed by laser light irradiation or a scratch made by a sharp knife, a scalpel, or the like as a trigger.

Physically separating the element region 260 enables separation in a larger area in a shorter time as compared to a method in which the element region 260 is separated by removing the separation layer with a solution, a gas, or the like. In addition, since a solution and a gas are not used, the level of safety is high. Therefore, as a method for separating the element region 260 from the substrate 200, the method in which force is applied for separation is most advantageous in terms of productivity and safety.

In the case where separation is performed with a physical means, the separation may be performed while a liquid such as water is poured. Thus, an adverse effect on the element region 260 due to static electricity caused by separation operation (e.g., a phenomenon in which a semiconductor element is damaged by static electricity) can be suppressed.

Note that in the case where an oxide semiconductor is used for the semiconductor layer 205, even when static electricity is produced, the semiconductor layer 205 can be prevented from receiving damage caused by the static electricity. This is because an oxide semiconductor has a higher withstand voltage and a lower possibility of dielectric breakdown than a general semiconductor layer including a silicon material.

In separation of the element region 260 along the separation layer 250, the substrate 200 is fixed so as not to be moved and bent as much as possible, which enables suppression of force locally applied to the element region 260. Accordingly, the element region 260 can be separated without any problem (e.g., the element region 260 is not cracked). As a method for fixing the substrate 200, for example, a method for fixing the substrate 200 to a stable base using an adhesive material, a method for fixing the substrate 200 using a vacuum chuck, or the like is employed. It is preferable that the substrate 200 be fixed using a vacuum chuck in consideration of trouble for separating the substrate 200 and reuse of the substrate 200. Specifically, a vacuum chuck, which has a porous surface (also referred to as a porous chuck) is preferably used because the entire surface of the substrate 200 can be fixed with uniform force.

Note that before providing the adhesive 900 for separation over the element region 260, fluid-jet cleaning, ultrasonic cleaning, plasma cleaning, UV cleaning, ozone cleaning, or the like is preferably performed on the element region 260 so that dust and organic components attaching to the surface of the element region 260 are removed.

Next, the first support 800 is bonded to the other surface of the element region 260 with an adhesive 808 for fixation interposed therebetween (see FIG. 9B).

As a material of the adhesive 808 for fixation, various curable adhesives, e.g., a light curable adhesive such as a UV curable adhesive, a reactive curable adhesive, a thermal curable adhesive, and an anaerobic adhesive can be used.

The adhesive 808 for fixation is preferably formed to be thin and have a uniform thickness using any of coating machines such as a spin coater, a slit coater, a gravure coater, and a roll coater, or any of printing machines such as a flexible printing machine, an offset printing machine, a gravure printing machine, a screen printing machine, and an inkjet machine.

For the first support 800, any of various materials having high toughness (specifically, the fracture toughness is greater than or equal to 1.5 [$MPa \cdot m^{1/2}$] is used. For example, an organic resin substrate, an organic resin thin film, a metal substrate, a metal thin film, or the like is used. Thus, a liquid crystal display device which is thin, lightweight, and less prone to fracture even in the case where force is applied externally, for example, an impact is made or bending is performed, can be manufactured. Note that various materials having high toughness generally have high flexibility as well as toughness, so that the first support 800 having high toughness can be freely bent. The thickness of the first support 800 may be determined as appropriate depending on use application of a liquid crystal display device. For example, when a liquid crystal display device is provided while being bent along a shape such as a curved surface, or is rolled up to be carried, the first support 800 may be thin. When a liquid crystal display device is used under the condition that a load is constantly applied, the first support 800 may be thick.

As the organic resin substrate and the organic resin thin film, for example, a substrate and a thin film including as a component at least one kind of resin selected from the following resins can be used: a poly(ethylene terephthalate) (PET) resin, a poly(ether sulfone) (PES) resin, a poly(ethylene naphthalate) (PEN) resin, a poly(vinyl alcohol) (PVA) resin, a polycarbonate (PC) resin, a nylon resin, an acrylic resin, a polyacrylonitrile resin, a polyetheretherketone (PEEK) resin, a polystyrene (PS) resin, a polysulfone (PSF) resin, a polyetherimide (PEI) resin, a polyarylate (PAR) resin, a poly(butylene terephthalate) (PBT) rein, a polyimide (PI) resin, a polyamide (PA) resin, a poly(amide imide) (PAI) resin, a polyisobutylene (PIB) resin, a chlorinated polyether (CP) resin, a melamine (MF) resin, an epoxy (EP) resin, a poly(vinylidene chloride) (PVdC) resin, a polypropylene (PP) resin, a polyacetal (POM) resin, a fluororesin (polytetrafluoroethylene (PTFE)), a phenol (PF) resin, a furan (FF) resin, an unsaturated polyester resin (fiber reinforced plastic (FRP)), a cellulose acetate (CA) resin, a urea (UF) resin, a xylene (XR) resin, a diallyl phthalate (DAP) resin, a poly (vinyl acetate) (PVAc) resin, a polyethylene (PE) resin, and an ABS resin.

As the metal substrate or the metal thin film, for example, aluminum (Al), titanium (Ti), nickel (Ni), chromium (Cr), molybdenum (Mo), tantalum (Ta), beryllium (Be), zirconium (Zr), gold (Au), silver (Ag), copper (Cu), zinc (Zn), iron (Fe), lead (Pb), or tin (Sn), or a substrate or a thin film including an alloy containing any of these elements can be used.

In the case of a reflective liquid crystal display device which displays images by utilizing reflection of external light as in this embodiment, the above metal substrate or metal thin film having high visible light reflectance is preferably selected as a material of the first support 800 to be used. In particular, the metal substrate or metal thin film having a thermal expansion coefficient of less than or equal to 20 ppm/° C. is preferred. In the case of a transmissive or transflective liquid crystal display device which displays images with the use of a backlight as a light source, an organic resin substrate or an organic resin thin film having high visible light transmittance is preferably used as the first support 800, more preferably, an organic resin substrate or an organic resin thin film having a thermal expansion coefficient of less than or equal to 20 ppm/° C. without retardation (birefringence phase difference) is used.

Note that the first support 800 has a single layer structure in this embodiment; however, a protective layer may be formed on a top surface or a bottom surface of the first support 800. As the protective layer, an inorganic thin film such as a silicon oxide ($SiO_2$) film, a silicon nitride (SiN) film, a silicon oxynitride (SiON) film, and a silicon nitride oxide (SiNO) film, a metal film such as an aluminum (Al) film or a magnesium (Mg) film, or an oxide film of any of the metals can be used. In particular, a film with low water vapor permeability, low gas permeability, and low UV transmittance is preferably used. The protective layer is preferably formed by a sputtering method or a plasma CVD method, for example.

Note that in the case of a transmissive or transflective liquid crystal display device, an inorganic film, a metal oxide film, or the like having a relatively high visible light transmittance is preferably used. On the other hand, in the case of a reflective liquid crystal display device, a metal film having a high visible light reflectance is preferably used.

Alternatively, as the protective layer, a resin having resistance to a solvent may be used. The component of the protective layer may be appropriately selected depending on the kind of a chemical solution used for substrate cleaning and the kind of a solvent included in an alignment film. The component of the protective layer may be appropriately selected from, for example, a poly(vinyl chloride) (PVC) resin, a poly(vinyl alcohol) (PVA) resin, a polyisobutylene (PIB) resin, an acrylic (methacryl) (PMMA) resin, a cellulose acetate (CA) resin, a urea (UF) resin, a xylene (XR) resin, a diallyl phthalate (DAP) resin, a poly(vinyl acetate) resin (PVAc), a polyethylene (PE) resin, a polyamide (PA) (nylon) resin, a polycarbonate (PC) resin, a chlorinated polyether (CP) resin, a melamine (MF) resin, an epoxy (EP) resin, a poly(vinylidene chloride) (PVdC) resin, a polystyrene (PS) resin, a polypropylene (PP) resin, a polyacetal (POM) resin, a fluororesin (polytetrafluoroethylene (PTFE)), a phenol (PF) resin, a furan (FF) resin, an unsaturated polyester resin (fiber reinforced plastic (FRP)), an ABS rein, and the like. With such a resin for the protective layer, it is possible to prevent a change in quality of the first support due to the chemical solution used for substrate cleaning and the solvent included in the alignment film.

The protective layer is preferably formed to be thin and have a uniform thickness using any of coating machines such as a spin coater, a slit coater, a gravure coater, and a roll coater, or any of printing machines such as a flexible printing machine, an offset printing machine, a gravure printing machine, a screen printing machine, and an inkjet machine.

Although the first support 800 is bonded to the other surface of the element region 260 with the adhesive 808 for fixation interposed therebetween in this embodiment, when a member in which a fibrous body is impregnated with an organic resin (a so-called prepreg) is used as the first support 800, the organic resin with which the fibrous body is impregnated has a function of the adhesive 808 for fixation; thus, the element region 260 and the first support 800 can be bonded to each other without the adhesive 808 for fixation. At this time, as the organic resin for the member, a reactive curable resin, a thermosetting resin, a UV curable resin, or the like which is cured by additional treatment is preferably used.

In this embodiment, a stainless steel film (a so-called SUS film which is made of a material which contains iron as a base and to which chromium, nickel, or the like is added) is used as the first support, and a thermosetting adhesive is lightly applied to a surface of the stainless steel film with a screen printing apparatus. The stainless steel film to which the thermosetting adhesive is applied is attached to the other surface of the element region and curing treatment is performed.

Note that before providing the adhesive 808 for fixation over the first support 800, fluid-jet cleaning, ultrasonic cleaning, plasma cleaning, UV cleaning, ozone cleaning, or the like is preferably performed on the first support 800 so that dust and organic components attaching to the surface of the first support 800 are removed.

Further, heat treatment may be performed on the first support 800. By the heat treatment, moisture and impurities attaching to the first support can be removed. Further, by the heat treatment in a reduced pressure state, moisture and impurities can be removed more efficiently. When the heat treatment is performed, a substrate with heat resistance high enough to withstand the heat treatment is preferably used as the first support 800.

Note that as for the cleaning method and the heat treatment, any one of the above cleaning methods and the heat treatment may be selected or two or more of the cleaning methods and the heat treatment may be performed in combination. For example, after fluid-jet cleaning is performed to remove dust attaching to the first support 800, ozone cleaning is performed to remove organic components, and then heat treatment is performed lastly to remove moisture attaching to and absorbed in the first support 800 when the fluid-jet cleaning is performed. In such a manner, dust, organic components and moisture on and in the first support 800 can be effectively removed.

Next, the adhesive 900 for separation and the temporary supporting base 902 are removed from the element region 260.

In this embodiment, a water-soluble adhesive and a UV separation tape are used as the adhesive 900 for separation and the temporary supporting base 902, respectively. Therefore, UV irradiation treatment is performed to remove the temporary supporting base 902 first, and then the adhesive 900 for separation is removed by cleaning with water.

Due to the high toughness, the first support 800 has enough flexibility to be deformed by application of external stress. Therefore, the temporary supporting base 902 is preferably separated from the element region 260 in the state where a substrate with high rigidity is bonded to the first support 800 with an adhesive material provided between the substrate with high rigidity and the first support 800 so that deformation or fracture is not produced when a load is applied to the first support 800 in separation operation and a later step. When the substrate with high rigidity is thus bonded, a manufacturing apparatus used for a glass substrate or the like can be used as it is.

Through the above steps, the first support 800 whose surface is provided with the element region 260 with the adhesive 808 for fixation interposed therebetween can be manufactured.

Note that an alignment film is not necessarily provided in a liquid crystal display device according to this embodiment, in which a liquid crystal material exhibiting a blue phase is used as a liquid crystal layer; thus, an alignment film is not illustrated in FIGS. 8A and 8B, FIGS. 9A to 9C, FIGS. 10A to 10C, and FIGS. 11A and 11B. However, in the case of a liquid crystal display device in which a liquid crystal material which does not exhibit a blue phase is used as a liquid crystal layer, an alignment film (for example, an insulating organic material such as polyimide (PI), poly(vinyl alcohol) (PVA), or poly(vinyl cinnamate) (PVCi) may be used) may be formed over the element region 260 (at least over the pixel electrode 210), and rubbing treatment (for example, the alignment film is rubbed using a roller or the like provided with fiber including rayon fiber, cotton fiber, nylon fiber, or the like as its main material) may be performed on the alignment film so that the alignment film has an alignment property.

In the case where a liquid crystal material exhibiting a blue phase is used as a liquid crystal layer, an alignment film is not necessarily provided, so that rubbing treatment is also unnecessary. Therefore, electrostatic discharge caused by rubbing treatment can be prevented and defects and damage of the liquid crystal display device in the manufacturing process can be reduced. Accordingly, there is also an advantage that the productivity of the liquid crystal display device can be increased.

<Step of Forming Second Support>

Figure 10A:
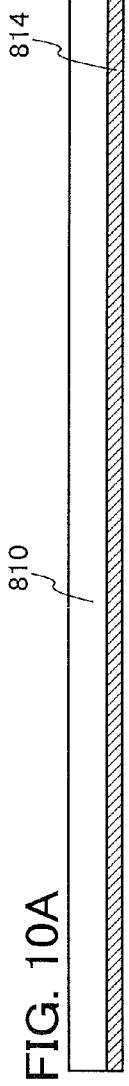
FIGS. 10A to 10C are cross-sectional process views illustrating the one embodiment of the present invention.

Next, the second support 810 is prepared and the fourth conductive layer 814 is provided on one surface of the second support 810 (see FIG. 10A). Note that, in this embodiment, a color filter is not provided because description of a monochrome liquid crystal display device is given; however, a color filter may be provided between the second support 810 and the fourth conductive layer 814 when a color liquid crystal display device is manufactured.

In the case of providing color filters, in general, color filters of three colors of R, G, and B R, G, and B correspond to red, green, and blue, respectively) are provided in a pixel portion; however, one embodiment of the present invention is not limited thereto. For example, color filters of R, G, B, and W (W corresponds to white), or color filters of R, G, B, and one or more of yellow, cyan, magenta, and the like may be provided. Further, the sizes of display regions may be different between respective dots of color elements. As a display method in the pixel portion, a progressive method, an interlace method, or the like can be employed.

Further, the second support may be provided with a black matrix (light-blocking layer) or an optical member (optical substrate) such as a retardation member or an anti-reflection member as appropriate.

In this embodiment, the case where the driving method of the liquid crystal display device is a VA mode is described; thus, a structure for a vertical electric field mode in which the fourth conductive layer 814 is formed on one surface of the second support 810 and the liquid crystal material 840 is sandwiched between the pixel electrode 210 and the fourth conductive layer 814 is employed. However, in the case of the driving method for a horizontal electric field mode is employed, the fourth conductive layer 814 is not necessarily provided over the second support 810.

For the second support 810, any of various materials having high toughness (specifically, the fracture toughness is greater than or equal to 1.5 [MPa·m$^{1/2}$]) is used. Since the second support needs to have a property of not blocking light which travels to the outside, an organic resin substrate or an organic resin thin film is used. Thus, a liquid crystal display device which is thin, lightweight, and less prone to fracture even in the case where force is applied externally, for example, an impact is made or bending is performed, can be manufactured. Note that various materials having high toughness generally have high flexibility as well as toughness, so that the second support 810 having high toughness can be freely bent. The thickness of the second support 810 may be determined as appropriate depending on use application of a liquid crystal display device. For example, when a liquid crystal display device is provided while being bent along a shape such as a curved surface, or is rolled up to be carried, the second support 810 may be thin. Further, when a liquid crystal display device is used under the condition that a load is constantly applied, the second support 810 may be thin.

As the organic resin substrate and the organic resin thin film, a material similar to that for the first support 800 may be used.

Formation of a protective layer on the second support 810, cleaning of the second support 810, and the like are similar to those of the first support 800; thus, description thereof is omitted here.

Due to the high toughness, the second support 810 has enough flexibility to be deformed by application of external stress. Therefore, a substrate with high rigidity is preferably bonded to the second support 810 with an adhesive material provided therebetween so that deformation or fracture is not produced when a load is applied to the second support 810 in a later step. When the substrate with high rigidity is thus bonded, a manufacturing apparatus used for a glass substrate or the like can be used as it is. Note that since the substrate with high rigidity needs to be separated after the second support 810 is bonded to the element region 260, a low viscosity adhesive (e.g., silicon rubber) or a material whose adhesiveness can be weakened by light irradiation or heat treatment (e.g., a UV separation tape or a thermal separation tape) is preferably used as an adhesive.

The fourth conductive layer 814 can be formed to have a single-layer structure or a layered structure using a layer including as its main component a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, by a sputtering method, a plasma CVD method, a coating method, a printing method, or the like.

In this embodiment, a polyimide film is used as the second support 810, and an ITO film is formed as the fourth conductive layer 814 to a thickness of 200 nm over the polyimide film by a sputtering method.

Although not illustrated in FIG. 10A, a spacer material (a material for keeping a distance (a so-called gap) for providing the liquid crystal material 840 between the pixel electrode 210 and the fourth conductive layer 814 when the first support 800 and the second support 810 are bonded to each other) may be provided on the fourth conductive layer 814 as necessary after the fourth conductive layer 814 is formed.

Note that an alignment film is not necessarily provided in the liquid crystal display device according to this embodiment, in which a liquid crystal material exhibiting a blue phase is used as a liquid crystal layer; thus, an alignment film is not illustrated in FIG. 10A. However, in the case of a liquid crystal display device in which a liquid crystal material which does not exhibit a blue phase as a liquid crystal phase is used, an alignment film (for example, an insulating organic material such as polyimide (PI), poly(vinyl alcohol) (PVA), or poly(vinyl cinnamate) (PVCi) may be used) may be formed over the fourth conductive layer 814, and rubbing treatment (for example, the alignment film is rubbed using a roller or the like provided with fiber including rayon fiber, cotton fiber, nylon fiber, or the like as its main component) may be performed on the alignment film so that the alignment film has an alignment property.

Note that although the step of forming the fourth conductive layer 814 on the second support 810 follows the step of providing the element region 260 over the first support 800 with the adhesive 808 for fixation interposed therebetween in this embodiment, there in no limitation on the order of these manufacturing steps. The steps are preferably performed concurrently to reduce manufacturing time of a liquid crystal display device.

<Step of Sealing Liquid Crystal Layer>

Figure 10B:
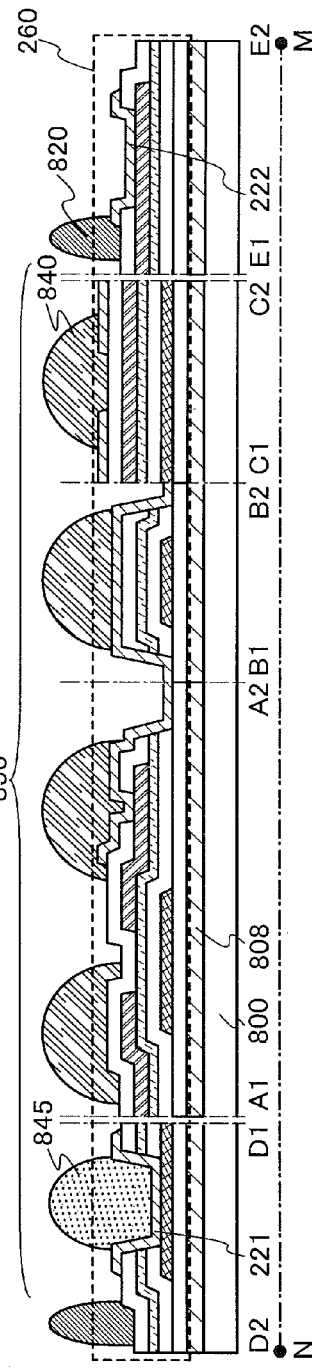

After the first support 800 whose surface is provided with the element region 260 with the adhesive 808 for fixation interposed therebetween is prepared, the sealant 820 is provided on the periphery of the pixel portion 850 so as to surround the pixel portion 850, the first conductive material 845 is provided over the electrode 221, and then the liquid crystal material 840 is provided over the pixel portion 850 (see FIG. 10B).

In providing the sealant 820, any of the following printing machines such as a flexible printing machine, an offset printing machine, a gravure printing machine, a screen printing machine, an inkjet machine, and a dispenser may be used. As the sealant 820, any of various curable adhesives, e.g., a photo-curable adhesive such as a UV curable adhesive, a reactive curable adhesive, a thermosetting adhesive, and an anaerobic adhesive may be used. In view of productivity and the influence on various materials used for the liquid crystal display device, a photo-curable adhesive which does not need cure treatment under a high temperature condition and is cured in a short time is preferably used. Further, the sealant 820 may include a spacer material.

Note that although only one line of the sealant 820 is provided so as to surround the pixel portion 850 in FIGS. 8A and 8B and FIGS. 10A to 10C, plural lines of the sealants 820 may be provided. By providing plural lines of the sealants 820, the first support 800 and the second support 810 can be firmly bonded to each other.

As the first conductive material 845, a material including a conductive particle and an organic resin is used. Specifically, a material in which conductive particles each having a diameter of several nanometers to several tens of micrometers are dispersed in an organic resin is used. As the conductive particles, metal particles of one or more of gold (Au), silver (Ag), copper (Cu), nickel (Ni), platinum (Pt), palladium (Pd), tantalum (Ta), molybdenum (Mo), titanium (Ti), aluminum (Al), and carbon (C), an insulating particle (such as a glass particle or an organic resin particle) whose surface is provided with a metal film containing one or more of the above metals, microparticles of silver halide, or the like can be used. As the organic resin contained in the first conductive material 845, one or more of the following can be used: an organic resin serving as a binder of the metal particle, an organic resin serving as a solvent of the metal particle, an organic resin serving as a dispersant of the metal particle, or an organic resin serving as a coating member of the metal particle. Organic resins such as an epoxy resin or a silicone resin can be given as representative examples.

In providing the first conductive material 845, any of the following printing machines such as a flexible printing machine, an offset printing machine, a gravure printing machine, a screen printing machine, an inkjet machine, and a dispenser may be used.

As the liquid crystal material 840, lyotropic liquid crystal, thermotropic liquid crystal, low molecular liquid crystal, high molecular liquid crystal, discotic liquid crystal, ferroelectric liquid crystal, anti-ferroelectric liquid crystal, or the like is used. Note that the above liquid crystal materials exhibit a nematic phase, a cholesteric phase, a cholesteric blue phase, a smectic phase, a smectic blue phase, a cubic phase, a smectic D phase, a chiral nematic phase, an isotropic phase, or the like depending on conditions. A cholesteric blue phase and a smectic blue phase are seen in a liquid crystal material having a cholesteric phase or a smectic phase with a relatively short helical pitch of less than or equal to 500 nm. The alignment of the liquid crystal material has a double twist structure and the liquid crystal material has the order with a pitch of less than or equal to an optical wavelength. A blue phase is one of liquid crystal phases, which appears just before a cholesteric phase changes into an isotropic phase while temperature of cholesteric liquid crystal is increased.

Since the blue phase used in this embodiment appears only in a narrow temperature range, a liquid crystal composition in which 5 wt % or more of a chiral material is mixed is used for the liquid crystal material in order to broaden the temperature range. As for the liquid crystal composition which contains a blue-phase liquid crystal and a chiral material, the response speed is as high as 10 us to 100 us; an alignment film is not necessary due to optical isotropy; and viewing angle dependence is low. Therefore, quality of display images can be improved and cost reduction can be achieved.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm.

Figure 10C:
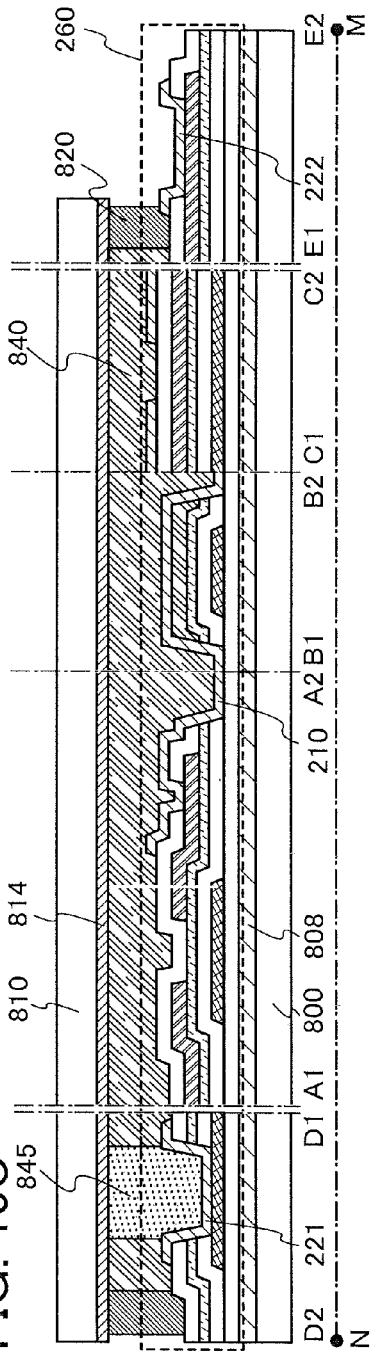

Next, the surface of the second support 810, which is provided with the fourth conductive layer 814, is bonded to the surface of the first support 800, which is provided with the liquid crystal material 840, and curing treatment is performed on the sealant 820 and the first conductive material 845 (see FIG. 10C).

The first support 800 and the second support 810 are preferably bonded to each other in a treatment chamber kept under reduced pressure in a vacuum bonding apparatus or the like. With such a method, bonding can be performed without inclusion of air bubbles in the sealant 820 or the liquid crystal material 840, and inclusion of an atmospheric component in the region surrounded by the sealant 820 can be suppressed.

Note that after the bonding is performed, a process for applying pressure to one side or both sides of the first support 800 and the second support 810 is preferably performed. Thus, the liquid crystal material 840 is uniformly formed in the region surrounded by the sealant 820.

The curing treatment is performed through one or plural kinds of processes selected from visible light irradiation, UV light irradiation, and heat treatment depending on material components of the sealant 820 and the first conductive material 845 such that the cure states of the sealant 820 and the first conductive material 845 are optimized. In the case where the sealant 820 and the first conductive material 845 are photo-curable materials for example, the wavelength, the intensity, and the time of irradiation light are determined as appropriate depending on cure conditions of the materials. Note that when materials for which cure conditions are the same (e.g., the sealant 820, and the first conductive material 845 are both photo-curable materials, and the wavelength and the strength of light for curing are almost the same) are used, the number of times of cure treatment can be reduced, which is preferable. To improve conductivity of the first conductive material 845 and to prevent defective conduction, pressure is preferably applied when the first conductive material 845 is cured.

In this embodiment, a method (a dropping method) is employed in which the first support 800 and the second support 810 are bonded to each other after dropping the sealant 820 and the liquid crystal material 840. Alternatively, a method (an injecting method) may be used in which, after the sealant 820 is dropped, the first support 800 and the second support 810 are bonded to each other, and then, the liquid crystal material 840 is injected into the region surrounded by the sealant 820 utilizing capillary action in a space generated between the first support 800 and the second support 810.

Figure 11A:
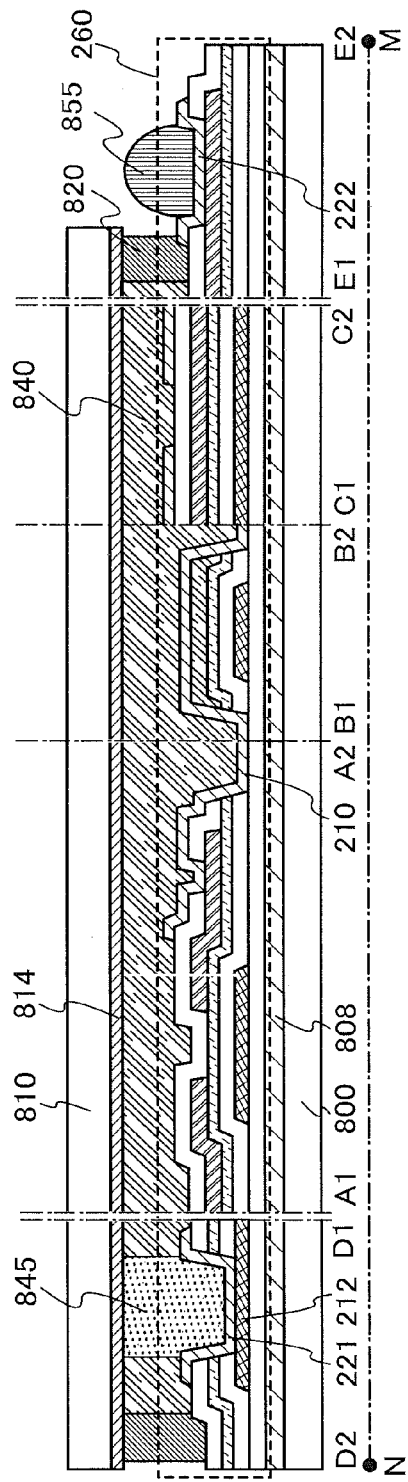
FIGS. 11A and 11B are cross-sectional process views illustrating the one embodiment of the present invention.

Next, the second conductive material 855 is provided over the electrode 222 over the first support 800 (see FIG. 11A).

As the second conductive material 855, for example, a material including a conductive particle and an organic resin is used. Specifically, a material in which conductive particles each having a diameter of several nanometers to several tens of micrometers are dispersed in an organic resin is used. As the conductive particles, metal particles of one or more of gold (Au), silver (Ag), copper (Cu), nickel (Ni), platinum (Pt), palladium (Pd), tantalum (Ta), molybdenum (Mo), titanium (Ti), aluminum (Al), and carbon (C), an insulating particle whose surface is provided with a metal film containing one or more of the above metals, microparticles of silver halide, or a solder material can be used. In addition, as the organic resin contained in the second conductive material 855, one or more of the following can be used: an organic resin serving as a binder of the metal particle, an organic resin serving as a solvent of the metal particle, an organic resin serving as a dispersant of the metal particle, or an organic resin serving as a coating member of the metal particle. Organic resins such as an epoxy resin or a silicone resin can be given as representative examples.

In providing the second conductive material 855, any of the following printing machines such as a flexible printing machine, an offset printing machine, a gravure printing machine, a screen printing machine, an inkjet machine, and a dispenser may be used.

In this embodiment, an epoxy resin mixed with flake-like silver particles each with a size of several nanometers to several tens of micrometers is used as the second conductive material 855.

Figure 11B:
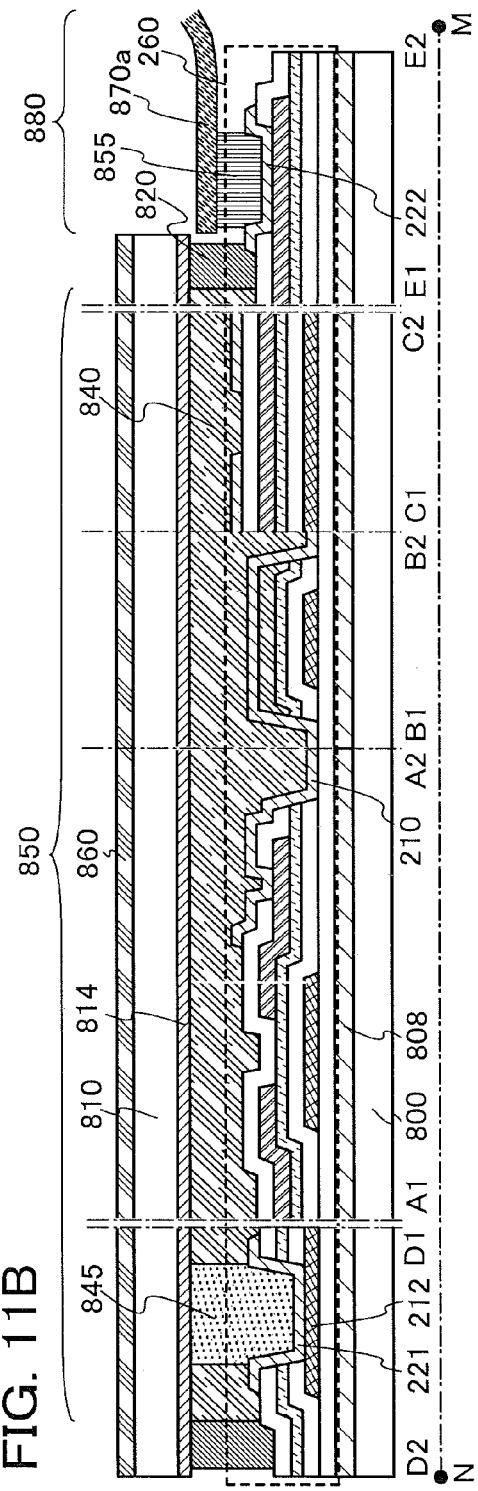

Next, the external wiring 870a is provided over the second conductive material 855 and a connection process is performed to electrically connect the external wiring 870a and the electrode 222, and a polarizing filter 860 is bonded to the second support 810 (see FIG. 11B).

As the external wiring 870a, for example, a printed wiring board or a flexible printed circuit (FPC) may be used. In the liquid crystal display device in this embodiment, both the base substrate and the counter substrate have high toughness and the liquid crystal display device may have flexibility; thus, it is preferable that the external wiring 870a also have flexibility.

For the connection process, the second conductive material 855 may be treated under a condition for curing the second conductive material 855 (visible light irradiation, UV light irradiation, or heat treatment). To improve conductivity of the second conductive material 855 and to prevent defective conduction between the electrode 222 and the second conductive material 855, pressure is preferably applied when the second conductive material 855 is subjected to the connection process. Note that the connection process is generally performed using a thermocompression bonding apparatus in which heat treatment is performed while pressure treatment is performed on the second conductive material 855 and the external wiring 870a.

Note that a light source is not provided in this embodiment because description is made on a reflective liquid crystal display device therein; however, a backlight, a sidelight, or the like may be provided as a light source on the first support 800 side in the case of a transmissive or transflective liquid crystal display device.

In addition, it is possible to employ a time-division display method (also called a field-sequential driving method) with use of a plurality of light-emitting diodes (LEDs) as a backlight. By employing a field-sequential driving method, color display can be performed without using a color filter.

Note that the polarizing filter 860 is provided only on the second support 810 side in this embodiment because description is made on a reflective liquid crystal display device therein; however, a polarizing filter may be also provided on the first support 800 side in the case of a transmissive or transflective liquid crystal display device. Note that although the polarizing filter 860 is bonded after the electrode 222 and the external wiring 870a are connected to each other in this embodiment, these steps may be performed in reverse order.

The element region 260 required for operation of the liquid crystal display device manufactured through the above process is manufactured with the use of a smaller number of photomasks than those used in the conventional case. In addition, the element region 260 is formed over the first support 800 whose fracture toughness is greater than or equal to 1.5 [$MPa \cdot m^{1/2}$]. Further, the second support 810 with which the liquid crystal material 840 is sandwiched also has a fracture toughness of greater than or equal to 1.5 [$MPa \cdot m^{1/2}$].

Thus, the number of photomasks can be reduced without a complicated technique or a special apparatus, and a liquid crystal display device which is thin, lightweight, and significantly tough can be manufactured.

Further, the use of materials with high flexibility for the first support 800 and the second support 810 enables manufacture of a liquid crystal display device which can be provided while being bent along a shape such as a curved surface or which can be rolled up to be carried.

This embodiment can be freely combined with any of the other embodiments.

(Embodiment 4)

In this embodiment, an example of an application mode of a semiconductor device according to one embodiment of the present invention will be described. A semiconductor device according to one embodiment of the present invention can be made flexible by being separated from a substrate over which the semiconductor device has been formed. Specific examples of electronic devices including semiconductor devices according to embodiments of the present invention will be described below with reference to FIGS. 12A to 12F. The electronic devices indicate a liquid crystal display device, a television device (also referred to as a TV simply, a TV receiver, or a television receiver), a cellular phone, and the like.

Figure 12A:
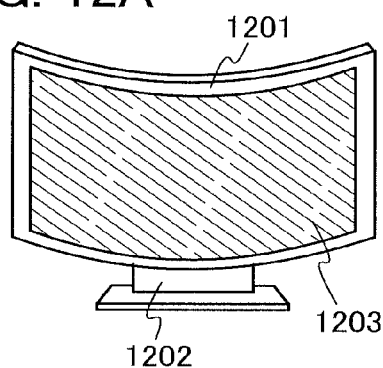
FIGS. 12A to 12F are views each illustrating an application example of an electronic device.

FIG. 12A illustrates a display 1201 which includes a supporting base 1202 and a display portion 1203. The display portion 1203 is formed using a flexible substrate, which can realize a lightweight and thin display. Further, the display portion 1203 can be bent, and can be detached from the supporting base 1202 and the display can be mounted along a curved wall. A flexible display, which is one application mode of a semiconductor device according to one embodiment of the present invention, can be manufactured with the use of the semiconductor device described in the above embodiment for the display portion 1203. Thus, the flexible display can be provided on a curved portion as well as a flat surface; therefore, it can be used for various applications.

Figure 12B:
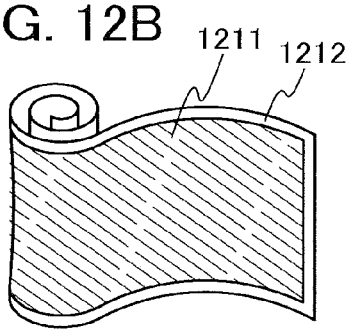

FIG. 12B illustrates a display 1211 capable of being wound, which includes a display portion 1212. A thin and large-area display capable of being wound, which is one application mode of a semiconductor device according to one embodiment of the present invention, can be manufactured with the use of the semiconductor device described in the above embodiment for the display portion 1212. Since the display 1211 capable of being wound is formed using a flexible substrate, the display 1211 can be carried by being bent or wound along with the display portion 1212. Therefore, even in the case where the display 1211 capable of being wound is large, the display 1211 can be carried in a bag by being bent or wound.

Figure 12C:
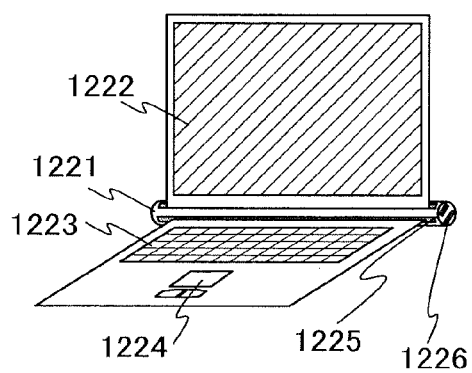

FIG. 12C illustrates a sheet-type computer 1221 which includes a display portion 1222, a keyboard 1223, a touch pad 1224, an external connection port 1225, a power plug 1226, and the like. A thin or sheet-type computer can be manufactured, which is one application mode of a semiconductor device according to one embodiment of the present invention, with the use of the semiconductor device described in the above embodiment for the display portion 1222. The display portion 1222 is formed using a flexible substrate, which can realize a lightweight and thin computer. Further, the display portion 1222 can be wound and stored in a main body when a portion of the main body of the sheet-type computer 1221 is provided with a storage space. Furthermore, by also forming the keyboard 1223 to be flexible, the keyboard 1223 can be wound and stored in the storage space of the sheet-type computer 1221 in a manner similar to that of the display portion 1222, which is convenient for carrying around. The computer can be stored without occupying a space by being bent when it is not used.

Figure 12D:
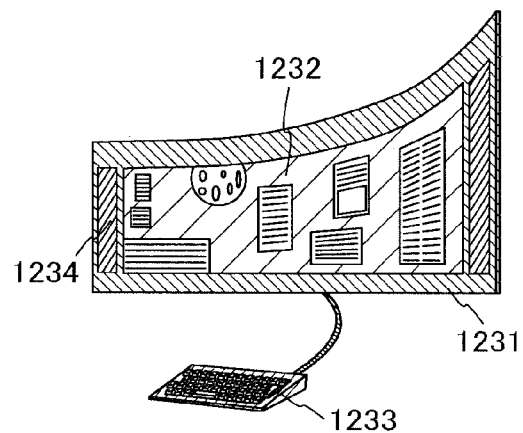

FIG. 12D illustrates a display device 1231 having a 20-inch to 80-inch large-sized display portion, which includes a keyboard 1233 that is an operation portion, a display portion 1232, a speaker 1234, and the like. Since the display portion 1232 is formed using a flexible substrate, the display device 1231 can be carried by being bent or wound with the keyboard 1233 detached. Further, the keyboard 1233 and the display portion 1232 can be connected without wires. For example, the display device 1231 can be mounted along a curved wall and can be operated with the keyboard 1233 without wires.

In the example in FIG. 12D, the semiconductor device described in the above embodiment is used for the display portion 1232. Thus, a thin and large-area display device can be manufactured, which is one application mode of a semiconductor device according to one embodiment of the present invention.

Figure 12E:
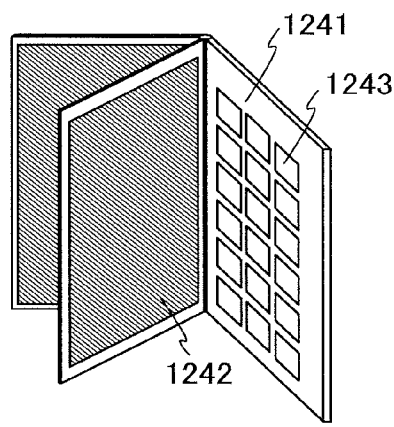

FIG. 12E illustrates an electronic book 1241 which includes a display portion 1242, an operating key 1243, and the like. In addition, a modem may be incorporated in the electronic book 1241. The display portion 1242 is formed using a flexible substrate and can be bent or wound. Therefore, the electronic book can also be carried without occupying a space. Further, the display portion 1242 can display a moving image as well as a still image such as a character.

In the example in FIG. 12E, the semiconductor device described in the above embodiment is used for the display portion 1242. Thus, a thin electronic book can be manufactured, which is one application mode of a semiconductor device according to one embodiment of the present invention.

Figure 12F:
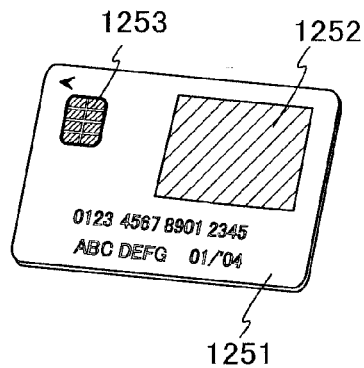

FIG. 12F illustrates an IC card 1251 which includes a display portion 1252, a connection terminal 1253, and the like. Since the display portion 1252 is formed using a flexible substrate to have a lightweight and thin sheet-like shape, it can be attached onto a card surface. When the IC card can receive data without contact, information obtained from outside can be displayed on the display portion 1252.

In the example in FIG. 12F, the semiconductor device described in the above embodiment is used for the display portion 1252. Thus, a thin IC card can be manufactured, which is one application mode of a semiconductor device according to one embodiment of the present invention.

When a semiconductor device according to one embodiment of the present invention is used for an electronic device, even in the case where external force such as bending is applied to the electronic device so that stress is caused thereon, damage of an element such as a transistor can be suppressed; thus, yield and reliability of the semiconductor device can be increased.

As described above, the application range of the present invention is so wide that the present invention can be applied to electronic devices and information displaying means in a wide variety of fields.

(Embodiment 5)

In this embodiment, with use of the liquid crystal display device manufactured according to Embodiment 3 as a display device which switches an image for a left eye and an image for a right eye at high speed, an example in which a 3D image which is a moving image or a still image is seen with dedicated glasses with which videos of the display device are synchronized is described with reference to FIGS. 13A and 13B.

Figure 13A:
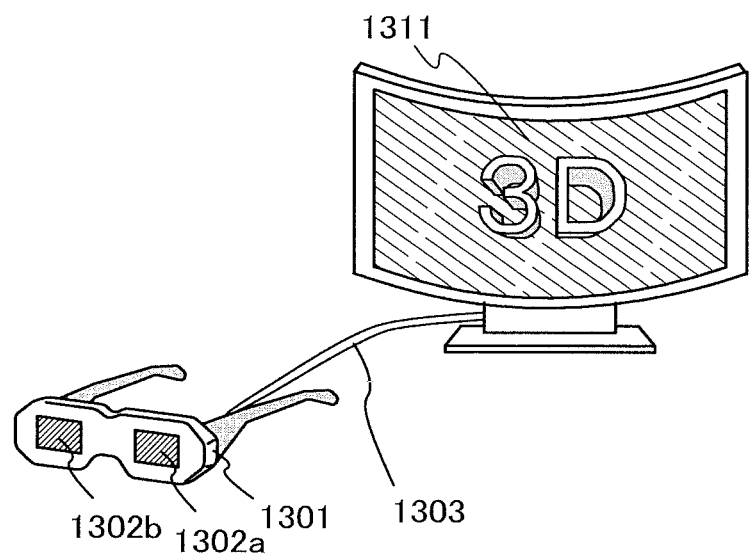
FIGS. 13A and 13B are views illustrating an application example of an electronic device.

FIG. 13A illustrates an external view in which a display device 1311 and dedicated glasses 1301 are connected to each other with a cable 1303. In the dedicated glasses 1301, shutters provided in a panel 1302a for a left eye and a panel 1302b for a right eye are alternately opened and closed, whereby a user can see an image of the display device 1311 as a 3D image.

Figure 13B:
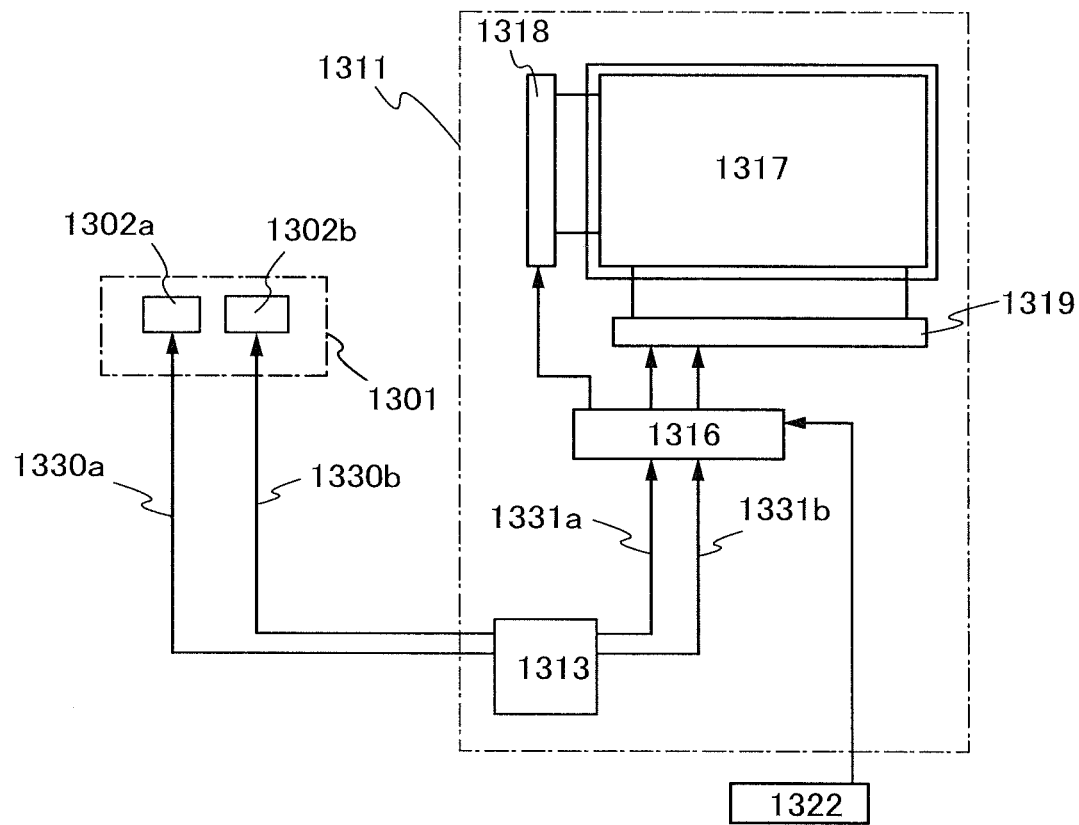

In addition, FIG. 13B is a block diagram illustrating a main structure of the display device 1311 and the dedicated glasses 1301.

The display device 1311 illustrated in FIG. 13B includes a display control circuit 1316, a display portion 1317, a timing generator 1313, a source line driver circuit 1318, an external operation unit 1322, and a gate line driver circuit 1319. A semiconductor device according to one embodiment of the present invention can be used for the display portion 1317. Note that an output signal changes in accordance with operation with the external operation unit 1322 such as a keyboard.

In the timing generator 1313, a start pulse signal and the like are formed, and a signal for synchronizing an image for a left eye and the shutter of the panel 1302a for a left eye, a signal for synchronizing an image for a right eye and the shutter of the panel 1302b for a right eye, and the like are formed.

A synchronization signal 1331a of the image for a left eye is input to the display control circuit 1316, so that the image for a left eye is displayed on the display portion 1317. At the same time, a synchronization signal 1330a for opening the shutter of the panel 1302a for a left eye is input to the panel 1302a for a left eye. In addition, a synchronization signal 1331b of the image for a right eye is input to the display control circuit 1316, so that the image for a right eye is displayed on the display portion 1317. At the same time, a synchronization signal 1330b for opening the shutter of the panel 1302b for a right eye is input to the panel 1302b for a right eye.

Since an image for a left eye and an image for a right eye are switched at high speed, the display device 1311 preferably employs a successive color mixing method (a field sequential method) in which color display is performed by time division with use of light-emitting diodes (LEDs).

Further, since a field sequential method is employed, it is preferable that the timing generator 1313 input the synchronization signals 1330a and 1330b to the backlight portion of the light-emitting diodes. Note that the backlight portion includes LEDs of colors of R, G, and B.

This embodiment can be combined with any of the other embodiments in this specification as appropriate.

This application is based on Japanese Patent Application serial no. 2010-204930 filed with the Japan Patent Office on Sep. 13, 2010, the entire contents of which are hereby incorporated by reference.

What is claimed is:

1. A method for manufacturing a liquid crystal display device, the method comprising:
   forming a gate electrode over a substrate;
   forming a gate insulating layer over the gate electrode;
   forming an oxide semiconductor layer over the gate insulating layer;
   forming a source electrode and a drain electrode over the oxide semiconductor layer;
   forming an insulating layer over the source electrode, the drain electrode, and the oxide semiconductor layer;
   forming a first contact hole in the insulating layer to expose part of one of the source electrode and the drain electrode;
   forming a second contact hole in the gate insulating layer, the oxide semiconductor layer, and the insulating layer; and
   forming a pixel electrode over the first contact hole, the pixel electrode being electrically connected to the part of the one of the source electrode and the drain electrode,
   wherein the first contact hole and the second contact hole are formed simultaneously, and
   wherein a portion of the insulating layer is provided between the pixel electrode and a side surface of the one of the source electrode and the drain electrode.

2. The method according to claim 1, wherein the oxide semiconductor layer comprises an element selected from gallium and indium.

3. The method according to claim 1,
   wherein the step of forming the pixel electrode is performed so as to cover the second contact hole.

4. The method according to claim 1, wherein the pixel electrode is in contact with a side surface of the oxide semiconductor layer in the second contact hole.

5. The method according to claim 1, wherein the pixel electrode is in contact with a side surface of the gate insulating layer in the second contact hole.

6. The method according to claim 1, further comprising a step of forming a base layer before the step of forming the gate electrode,
   wherein the step of forming the second contact hole is performed so that the base layer is exposed in the second contact hole.

7. The method according to claim 6, wherein the pixel electrode is in contact with the base layer in the second contact hole.

8. A method for manufacturing a liquid crystal display device, the method comprising:
   forming a separation layer over a substrate;
   forming a gate electrode over the separation layer;
   forming a gate insulating layer over the gate electrode;
   forming a oxide semiconductor layer over the gate insulating layer;
   forming a source electrode and a drain electrode over the oxide semiconductor layer;
   forming an insulating layer over the source electrode, the drain electrode, and the oxide semiconductor layer;
   forming a first contact hole in the insulating layer to expose part of one of the source electrode and the drain electrode;
   forming a second contact hole in the gate insulating layer, the oxide semiconductor layer, and the insulating layer; and
   forming a pixel electrode over the first contact hole, the pixel electrode being electrically connected to the part of the one of the source electrode and the drain electrode;
   separating the gate electrode, the gate insulating layer, the oxide semiconductor layer, the source electrode, the drain electrode, the insulating layer, and the pixel electrode from the substrate,
   wherein the first contact hole and the second contact hole are formed simultaneously, and
   wherein a portion of the insulating layer is provided between the pixel electrode and a side surface of the one of the source electrode and the drain electrode.

9. The method according to claim 8, wherein the oxide semiconductor layer comprises an element selected from gallium and indium.

10. The method according to claim 8,
    wherein the step of forming the pixel electrode is performed so as to cover the second contact hole.

11. The method according to claim 8, wherein the pixel electrode is in contact with a side surface of the oxide semiconductor layer in the second contact hole.

12. The method according to claim 8, wherein the pixel electrode is in contact with a side surface of the gate insulating layer in the second contact hole.

13. The method according to claim 8, further comprising a step of forming a base layer before the step of forming the gate electrode,
    wherein the step of forming the second contact hole is performed so that the base layer is exposed in the second contact hole.

14. The method according to claim 13, wherein the pixel electrode is in contact with the base layer in the second contact hole.

15. A method for manufacturing a liquid crystal display device, the method comprising:
    forming a gate electrode over a substrate;
    forming a gate insulating layer over the gate electrode;
    forming a first oxide semiconductor layer over the gate insulating layer;
    forming a second oxide semiconductor layer over the first oxide semiconductor layer;
    forming a source electrode and a drain electrode over the second oxide semiconductor layer;
    forming an insulating layer over the source electrode, the drain electrode, and the second oxide semiconductor layer;
    forming a first contact hole in the insulating layer to expose part of one of the source electrode and the drain electrode;
    forming a second contact hole in the gate insulating layer, the first oxide semiconductor layer, and the insulating layer; and
    forming a pixel electrode over the first contact hole, the pixel electrode being electrically connected to the part of the one of the source electrode and the drain electrode,
    wherein the first contact hole and the second contact hole are formed simultaneously, and
    wherein a portion of the insulating layer is provided between the pixel electrode and a side surface of the one of the source electrode and the drain electrode.

16. The method according to claim 15, wherein the first oxide semiconductor layer and the second oxide semiconductor layer each comprise an element selected from gallium and indium.

17. The method according to claim 15, wherein the second oxide semiconductor layer is thicker than the first oxide semiconductor layer.

18. The method according to claim 15,
    wherein the step of forming the pixel electrode is performed so as to cover the second contact hole.

19. The method according to claim 15, wherein the pixel electrode is in contact with a side surface of the first oxide semiconductor layer and a side surface of the second oxide semiconductor layer in the second contact hole.

20. The method according to claim 15, wherein the pixel electrode is in contact with a side surface of the gate insulating layer in the second contact hole.

21. The method according to claim 15, further comprising a step of forming a base layer before the step of forming the gate electrode,
   wherein the step of forming the second contact hole is performed so that the base layer is exposed in the second contact hole.

22. The method according to claim 21, wherein the pixel electrode is in contact with the base layer in the second contact hole.

* * * * *